United States Patent
Vaseem et al.

(10) Patent No.: US 11,390,768 B2
(45) Date of Patent: Jul. 19, 2022

(54) SILVER-ORGANO-COMPLEX INK WITH HIGH CONDUCTIVITY AND INKJET STABILITY

(71) Applicant: King Abdullah University of Science and Technology, Thuwal (SA)

(72) Inventors: Mohammad Vaseem, Thuwal (SA); Garret McKerricher, Thuwal (SA); Atif Shamim, Thuwal (SA)

(73) Assignee: KING ABDULLAH UNIVERSITY OF SCIENCE AND TECHNOLOGY, Thuwal (SA)

( * ) Notice: Subject to any disclaimer, the term of this patent is extended or adjusted under 35 U.S.C. 154(b) by 311 days.

(21) Appl. No.: 16/788,932

(22) Filed: Feb. 12, 2020

(65) Prior Publication Data

US 2020/0181438 A1     Jun. 11, 2020

Related U.S. Application Data

(63) Continuation of application No. 15/779,363, filed as application No. PCT/IB2016/057592 on Dec. 13, 2016, now Pat. No. 10,597,547.

(60) Provisional application No. 62/267,096, filed on Dec. 14, 2015.

(51) Int. Cl.
| | |
|---|---|
| C09D 11/52 | (2014.01) |
| H05K 3/12 | (2006.01) |
| C09D 11/38 | (2014.01) |
| C09D 5/24 | (2006.01) |
| H05K 1/02 | (2006.01) |
| H05K 1/09 | (2006.01) |

(52) U.S. Cl.
CPC ............... *C09D 11/52* (2013.01); *C09D 5/24* (2013.01); *C09D 11/38* (2013.01); *H05K 1/0237* (2013.01); *H05K 3/125* (2013.01); *H05K 1/095* (2013.01); *H05K 2201/10098* (2013.01); *H05K 2203/121* (2013.01); *H05K 2203/125* (2013.01)

(58) Field of Classification Search
CPC ... H05K 2203/121; H05K 2201/10098; H05K 3/125; C09D 11/52
See application file for complete search history.

(56) References Cited

U.S. PATENT DOCUMENTS

| | | |
|---|---|---|
| 2006/0130700 A1 | 6/2006 | Reinartz |
| 2008/0303885 A1 | 12/2008 | Jung |
| 2015/0336878 A1 | 11/2015 | Cho et al. |

FOREIGN PATENT DOCUMENTS

| | | |
|---|---|---|
| WO | 2007022595 A1 | 3/2007 |
| WO | 2011126706 A2 | 10/2011 |

(Continued)

OTHER PUBLICATIONS

"Vero White Plus", Stratasys, Polyjet Material Specifications, Retrieved from "https://www.stratasysdirect.com/technologies/polyjet", Jun. 26, 2019, 13 pages.

(Continued)

*Primary Examiner* — Khanh T Nguyen
(74) *Attorney, Agent, or Firm* — Billion & Armitage

(57) ABSTRACT

A robust formulation of silver-organo-complex (SOC) ink and method of making same are provided. In an aspect, the complexing molecules act as reducing agents. The silver loaded ink can be printed and sintered on a wide range of substrates with uniform surface morphology and excellent adhesion.

15 Claims, 21 Drawing Sheets

(56) References Cited

FOREIGN PATENT DOCUMENTS

| WO | 2013036519 | 3/2013 |
|---|---|---|
| WO | 2013096664 | 6/2013 |

OTHER PUBLICATIONS

"Vero White Plus—RGD835", Stratasys, Material Saftey Data Sheet, Feb. 7, 2019, 11 pages.
Ahmad, et al., "Inkjet Printed Bandpass Filters and Filtennas using Silver Nanoparticle Ink on Flexible Substrate", 2015 IEEE International Symposium on Antennas and Propagation & USNC/URSI National Radio Science Meeting, Jul. 19-24, 2015, 2 pages.
Ahn, et al., "Omnidirectional Printing of Flexible, Stretchable, and Spanning Silver Microelectrodes", Science, vol. 323, Mar. 20, 2009, pp. 1590-1593.
An, et al., "Selective Sintering of Metal Nanoparticle Ink for Maskless Fabrication of an Electrode Micropattern Using a Spatially Modulated Laser Beam by a Digital Micromirror Device", ACS Applied Materials & Interfaces, vol. 6, Jan. 28, 2014, pp. 2786-2790.
Arabi, et al., "Comparison of Filters: Inkjet Printed on PEN Substrate Versus a Laser-Etched on LCP Substrate", 44th European Microwave Conference, Oct. 6-9, 2014, pp. 1226-1229.
Butterworth, "On the Theory of Filter Amplifiers", Experimental Wireless & The Wireless Engineer, vol. 7, Oct. 1930, pp. 536-541.
Cao, et al., "Adhesion and Wetting of Nanoparticles on Soft Surfaces", Macromolecules, vol. 47, Apr. 18, 2014, pp. 3203-3209.
Chen, et al., "Solution based Beta-Diketonate Silver Ink for Direct Printing of Highly Conductive Features on a Flexible Substrate", Journal of Materials Chemistry C, vol. 1, 2013, pp. 5161-5168.
Chieh, et al., "Development of a Ku-Band Corrugated Conical Horn Using 3-D Print Technology", IEEE Antennas and Wireless Propagation Letters, vol. 13, Jan. 2014, pp. 201-204.
Cook, et al., "Inkjet-Printed, Vertically-Integrated, High-Performance Inductors and Transformers on Flexible LCP Substrate", International Microwave Symposium (IMS) IEEE International, Jun. 2014, 4 pages.
Derby, "Inkjet Printing of Functional and Structural Materials: Fluid Property Requirements, Feature Stability, and Resolution", Annual Review of Materials Research, vol. 40, Mar. 9, 2010, pp. 395-414.
Diaz, et al., "Inkjet Patterning of Multiline Intersections for Wirings in Printed Electronics", Langmuir, vol. 29, Sep. 2013, 7 pages.
Djordjevic, et al., "Wideband Frequency-Domain Characterization of FR-4 and Time-Domain Causality", IEEE Transactions on Electromagnetic Compatibility, vol. 43, No. 4, Nov. 2001, pp. 662-667.
Dong, et al., "Facile Synthesis of High Silver Content MOD Ink by using Silver Oxalate Precursor for Inkjet Printing Applications", Thin Solid Films, vol. 589,, Aug. 2015, pp. 381-387.
Falk, et al., "Infrared Spectra of Methanol and Deuterated Methanols in Gas, Liquid, and Solid Phases", Journal of Chemical Physics, vol. 34, No. 5, May 1961, pp. 1554-1568.
Frickey, "Conversions Between S, Z, Y, h, ABCD, and T Parameters which are Valid for Complex Source and Load Impedances", IEEE Transactions on Microwave Theory and Techniques, vol. 42, No. 2, Feb. 1994, pp. 205-211.
Gardner, et al., "Adhesion and Surface Issues in Cellulose and Nanocellulose", Journal of Adhesion Science and Technology, vol. 22, 2008, pp. 545-567.
Ghosh, "Fabrication of Electrically Conductive Metal Patterns at the Surface of Polymer Films by Microplasma-Based Direct Writing", ACS Applied Materials & Interfaces, vol. 6, 2014, pp. 3099-3104.
Hamedi, et al., "Highly Conducting, Strong Nanocomposites Based on Nanocellulose-Assisted Aqueous Dispersions of Single-Wall Carbon Nanotubes", ACS Nano, vol. 8, No. 3, Feb. 8, 2014, pp. 2467-2476.
Hong, et al., "Inkjet Printed Copper Source/Drain Metallization for Amorphous Silicon Thin-Film Transistors", IEEE Electron Device Letters, vol. 21, Issue 8, Aug. 2000, pp. 384-386.

Hummelgard, et al., "Electrical Sintering of Silver Nanoparticle Ink Studied by In-Situ TEM Probing", PLoS One, vol. 6, Issue 2, e17209, Feb. 24, 2011, pp. 1-6.
Iijima, et al., "Substrate and Size Effects on the Coalescence of Small Particles", Journal of Applied Physics, vol. 70, No. 9, Nov. 1, 1991, pp. 5138-5140.
Jan, et al., "A 32nm SoC Platform Technology with 2nd Generation High-k/Metal Gate Transistors Optimized for Ultra Low Power, High Performance, and High Density Product Applications", Electron Devices Meeting (IEDM), IEEE International 2009, Jan. 2010, 3 pages.
Joo, et al., "Adhesion Mechanisms of Nanoparticle Silver to Substrate Materials: Identification", Nanotechnology, vol. 21, Dec. 21, 2009, pp. 1-12.
Kamyshny, et al., "Conductive Nanomaterials for Printed Electronics", Small, vol. 10, Sep. 2014, pp. 1-21.
Kamyshny, et al., "Metal-Based Inkjet Inks for Printed Electronics", The Open Applied Physics Journal, vol. 4, 2011, pp. 19-36.
Kao, et al., "Inkjet-Printed Interdigital Coupled Line Filter on Liquid Crystal Polymer Substrate", IEEE Electron Device Letters, vol. 34, Issue 12, Dec. 2013, pp. 1584-1586.
Ladd, et al., "3D Printing of Free Standing Liquid Metal Microstructures", Advanced Materials, 2013, pp. 1-5.
Larkin, "Infrared and Raman Spectroscopy: Principles and Spectral Interpretation", 1st Edition, Elsevier Publications, May 25, 2011, 234 pages.
Lee, et al., "Long-Term Sustainable Aluminum Precursor Solution for Highly Conductive Thin Films on Rigid and Flexible Substrates", ACS Applied Materials & Interfaces, vol. 6, 2014, 8 pages.
Lee, et al., "Programmable Direct-Printing Nanowire Electronic Components", Nano Letters, vol. 10, Jan. 28, 2010, pp. 1016-1021.
Lee, et al., "Vacuum-Free, Maskless Patterning of Ni Electrodes by Laser Reductive Sintering of NiO Nanoparticle Ink and Its Application to Transparent Conductors", ACS Nano, vol. 8, No. 10, Aug. 17, 2014, pp. 9807-9814.
Li, et al., "Direct Writing on Paper of Foldable Capacitive Touch Pads with Silver Nanowire Inks", ACS Applied Materials Interfaces, vol. 6, 2014, 9 pages.
Liu, et al., "Laser Direct Synthesis and Patterning of Silver Nano/Microstructures on a Polymer Substrate", ACS Applied Materials & Interfaces, vol. 6, Jul. 30, 2014, pp. 14576-14582.
Magdassi, "The Chemistry of Inkjet Inks", World Scientific Publishing Co., 2010, 340 pages.
Magdassi, et al., "Triggering the Sintering of Silver Nanoparticles at Room Temperature", ACS Nano, vol. 4, No. 4, Apr. 7, 2010, pp. 1943-1948.
McKerricher, et al., "A Fully Inkjet Printed 3D Honeycomb Inspired Patch Antenna", IEEE Antennas and Wireless Propagation Letter, 2015, 5 pages.
McKerricher, et al., "Fully Inkjet Printed RF Inductors and Capacitors Using Polymer Dielectric and Silver Conductive Ink with Through Vias", IEEE Transactions on Electron Devices, vol. 62, No. 3, Mar. 2015, pp. 1002-1009.
Menicanin, et al., "Low-Cost CPW Meander Inductors Utilizing Ink-Jet Printing on Flexible Substrate for High-Frequency Applications", IEEE Transactions on Electron Devices, vol. 60, No. 2, Feb. 2013, pp. 827-832.
Nayeri, et al., "3D Printed Dielectric Reflectarrays: Low-Cost High-Gain Antennas at Sub-Millimeter Waves", IEEE Transactions on Antennas and Propagation, vol. 62, No. 4, Apr. 2014, pp. 2000-2008.
Okada, et al., "Modeling of Spiral Inductors", Advanced Microwave Circuits and Systems, Apr. 1, 2010, pp. 291-312.
Perelaer, et al., "One-Step Inkjet Printing of Conductive Silver Tracks on Polymer Substrates", Nanotechnology, vol. 20, Mar. 31, 2009, pp. 1-5.
Perelaer, et al., "Plasma and Microwave Flash Sintering of a Tailored Silver Nanoparticle Ink, Yielding 60% Bulk Conductivity on Cost-Effective Polymer Foils", Advanced Materials, vol. 24, Jun. 21, 2012, pp. 3993-3998.
Perelaer, et al., "Roll-to-Roll Compatible Sintering of Inkjet Printed Features by Photonic and Microwave Exposure: From Non-

(56) References Cited

OTHER PUBLICATIONS

Conductive Ink to 40% Bulk Silver Conductivity in Less Than 15 Seconds", Advanced Materials, vol. 24, May 2012, pp. 2620-2625.
Redinger, et al., "An Ink-Jet-Deposited Passive Component Process for RFID", IEEE Transactions on Electron Devices, vol. 51, No. 12, Dec. 2004, pp. 1978-1983.
Sette, et al., "Silver Nanoparticle Inkjet printed 17 GHz Filter", 2013 IEEE MTT-S International Microwave Symposium Digest (MTT), Jun. 2-7, 2013, 4 pages.
Shin, et al., "A Self-Reducible and Alcohol-Soluble Copper-Based Metal-Organic Decomposition Ink for Printed Electronics", ACS Applied Materials & Interfaces, vol. 6, Feb. 2014, pp. 1-9.
Snyder, et al., "3D Systems Technology Overview and New Applications in Manufacturing, Engineering, Science, and Education", 3D Printing and Additive Manufacturing, vol. 1, No. 3, Sep. 2014, pp. 169-176.
Sridhar, et al., "Inkjet-Printing- and Electroless-Plating-Based Fabrication of RF Circuit Structures on High-Frequency Substrates", Journal of Micromechanics and Microengineering, vol. 19, Jul. 14, 2009, pp. 1-11.
Sriprachuabwong, et al., "Simple RC Low Pass Filter Circuit Fabricated by Unmodified Desktop Inkjet Printer", ECTI-CON2010: 2010 ECTI International Conference on Electrical Engineering,Electronics, Computer, Telecommunications and Information Technology, May 19-21, 2010, 4 pages.
Torrisi, et al., "Inkjet-Printed Graphene Electronics", ACS Nano, vol. 6, 2012, pp. 1-12.
Garcia, et al., "Effects of Extreme Surface Roughness on 3D Printed Horn Antenna", Electronics Letters, vol. 49, No. 12, Jun. 6, 2013, 2 pages.
Tseng, "Scaling of Inkjet-Printed Transistors using Novel Printing Techniques", EECS Department, Dec. 16, 2011, 121 pages.
Valeton, et al., "Room Temperature Preparation of Conductive Silver Features using Spin-coating and Inkjet Printing", Journal of Materials Chemistry, vol. 20, 2010, pp. 543-546.
Vaseem, et al., "Inkjet Printed Fractal-Connected Electrodes with Silver Nanoparticle Ink", ACS Applied Materials & Interfaces, vol. 4, Jun. 6, 2012, pp. 3300-3307.
Walker, et al., "Reactive Silver Inks for Patterning High-Conductivity Features at Mild Temperatures", Journal of the American Chemical Society, vol. 134, 2012, 3 pages.
Wu, et al., "3D-Printed Microelectronics for Integrated Circuitry and Passive Wireless Sensors", Microsystems & Nanoengineering, vol. 1, Jul. 20, 2015, pp. 1-9.
Wubbenhorst, et al., "Dielectric Relaxations in Ultra-Thin Films of PMMA: Assessing the Length Scale of Cooperativity in the Dynamic Glass Transition", 11th International Symposium on Electrets, ISE 11, Feb. 2002, pp. 1-6.
Zheng, et al., "Personal Electronics Printing via Tapping Mode Composite Liquid Metal Ink Delivery and Adhesion Mechanism", Scientific Reports,vol. 4, Apr. 4, 2014, pp. 1-8.
"High-Q Multilayer Chip Inductors" Taiyo Yuden, Retreived from "https://www.mouser.com/new/taiyo-yuden/taiyo-yuden-hkq-w-inductors/", Jun. 26, 2019, 2 pages.
Database WPI Week 201641 Thomason Scientific, London, GB; AN 2016-189647 AP002767116, -& CN 105 419 488 A (New Materials Inst Shandong Acad Sci) Mar. 23, 2016.
PCT Search Report and Written Opinion for PCT/IB2016/057592 dated Mar. 13, 2017.
Vaseem, et al., "Robust Design of a Particle-Free Silver-Organo-Complex Ink with High Conductivity and Inkjet Stablity for Flexible Electronics", ACS Applied Materials and Interfaces, vol. 8, No. Jan. 13, 2016, pp. 177-186.

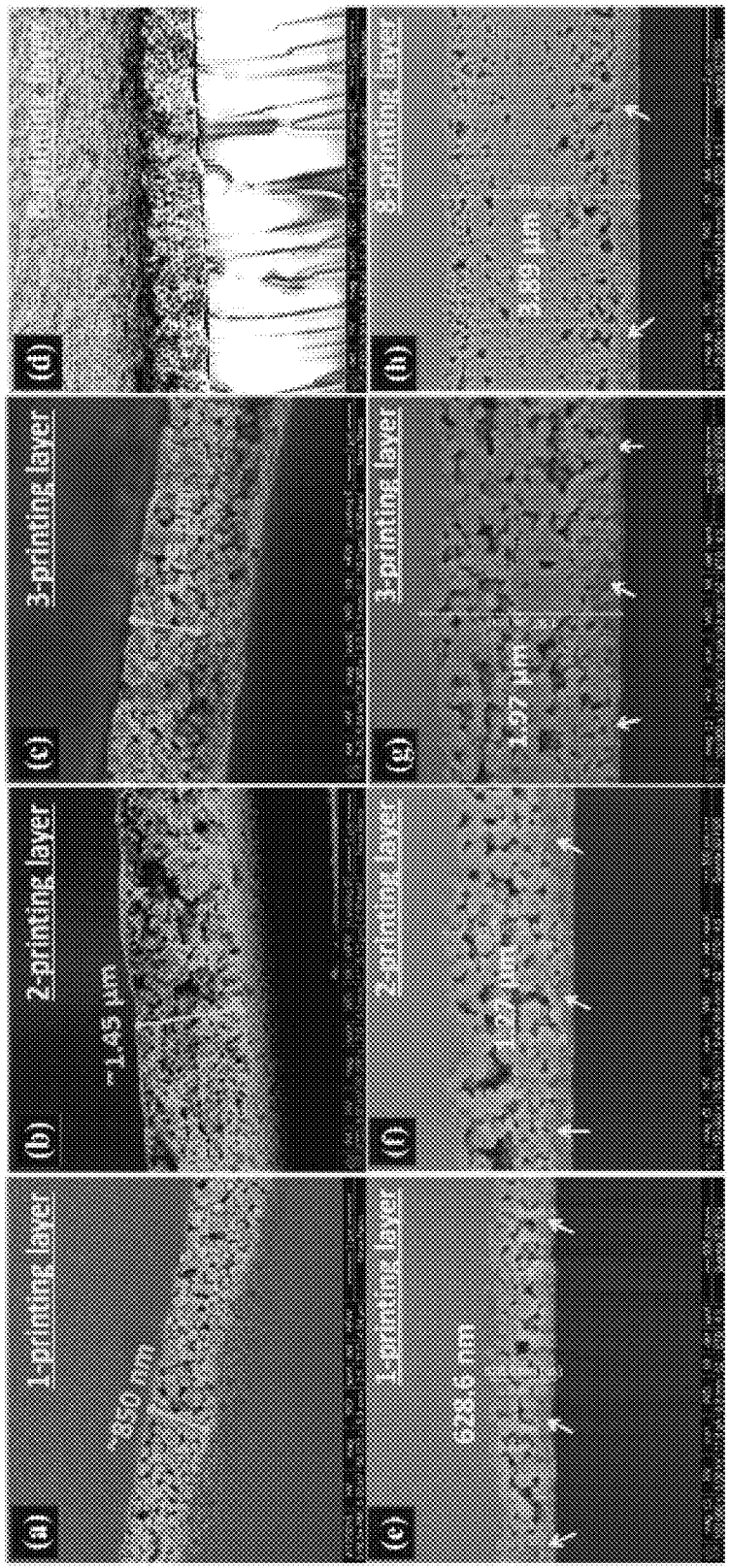

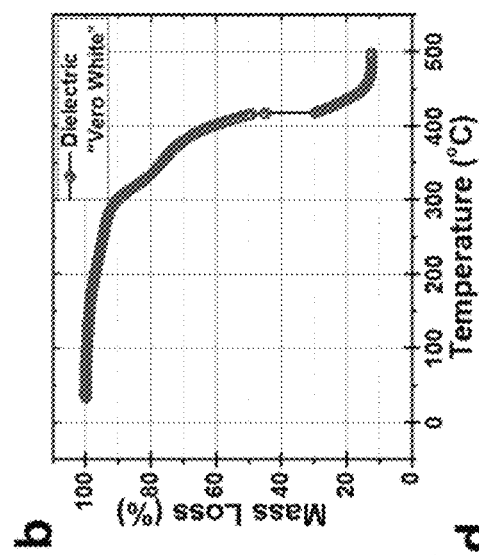
Fig. 10A
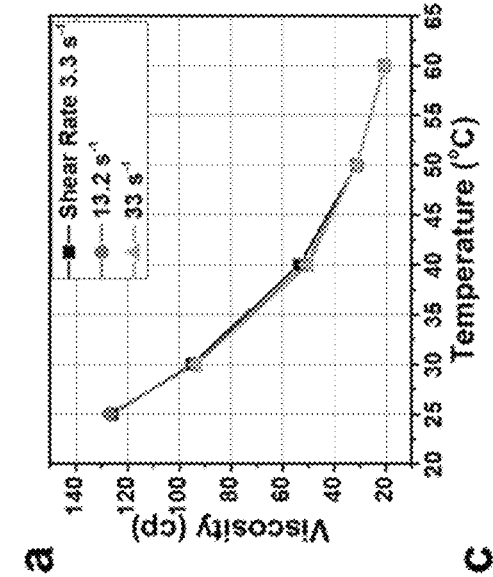
Fig. 10B
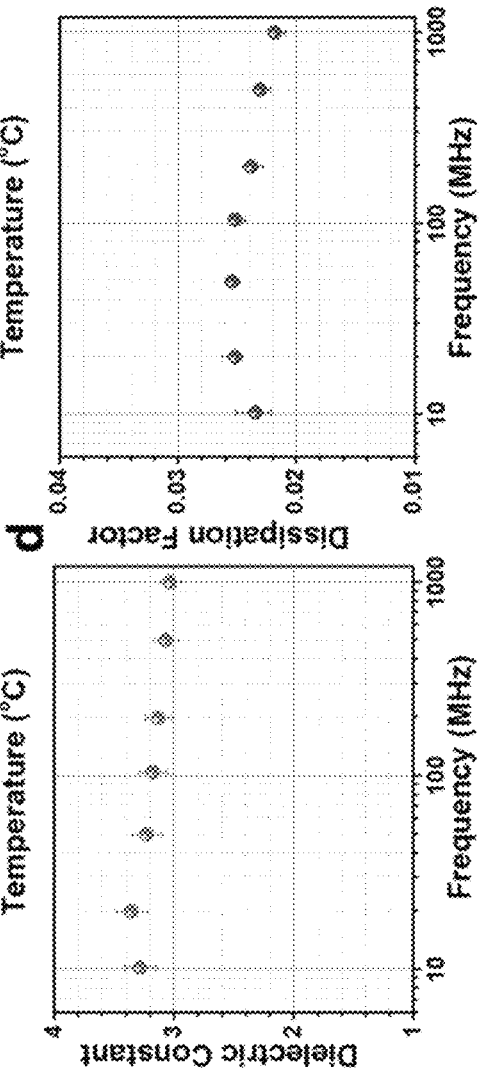
Fig. 10C
Fig. 10D

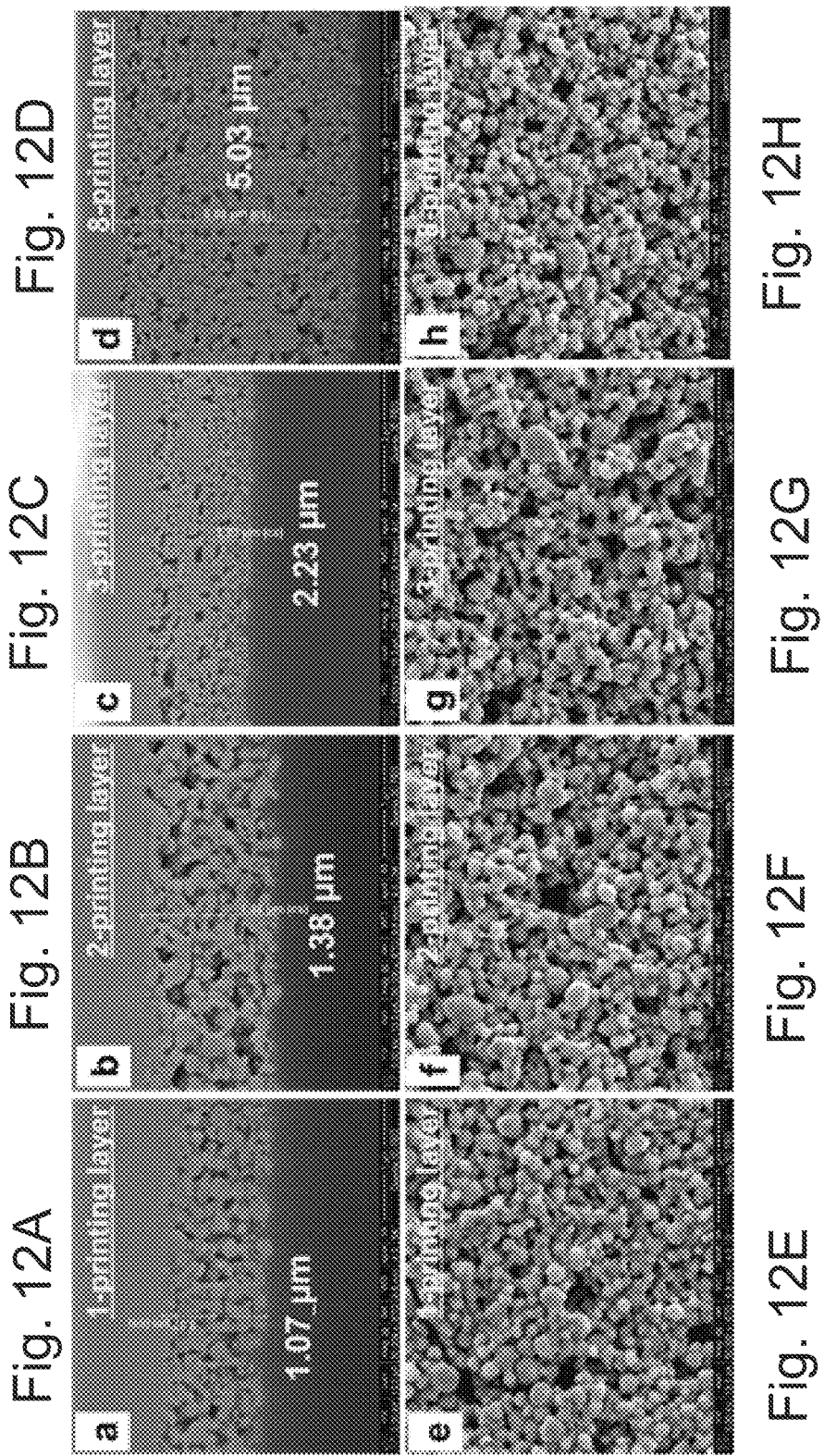

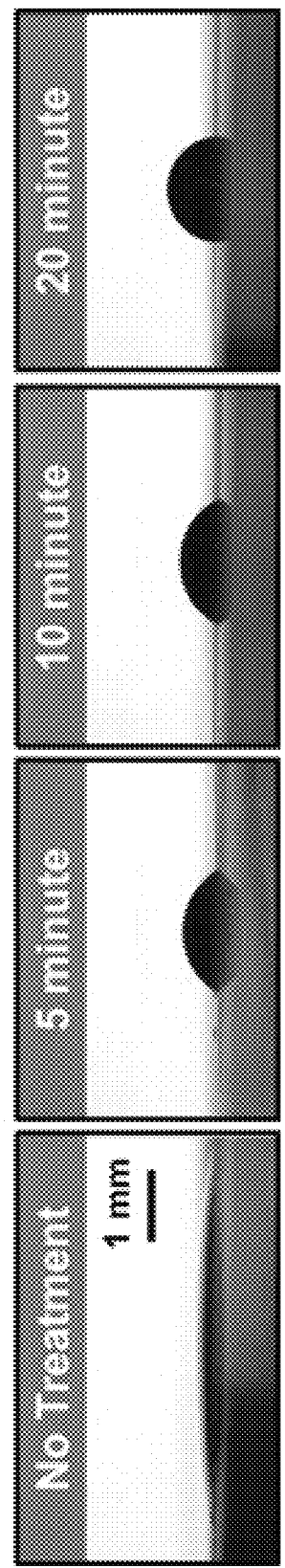
FIG. 14
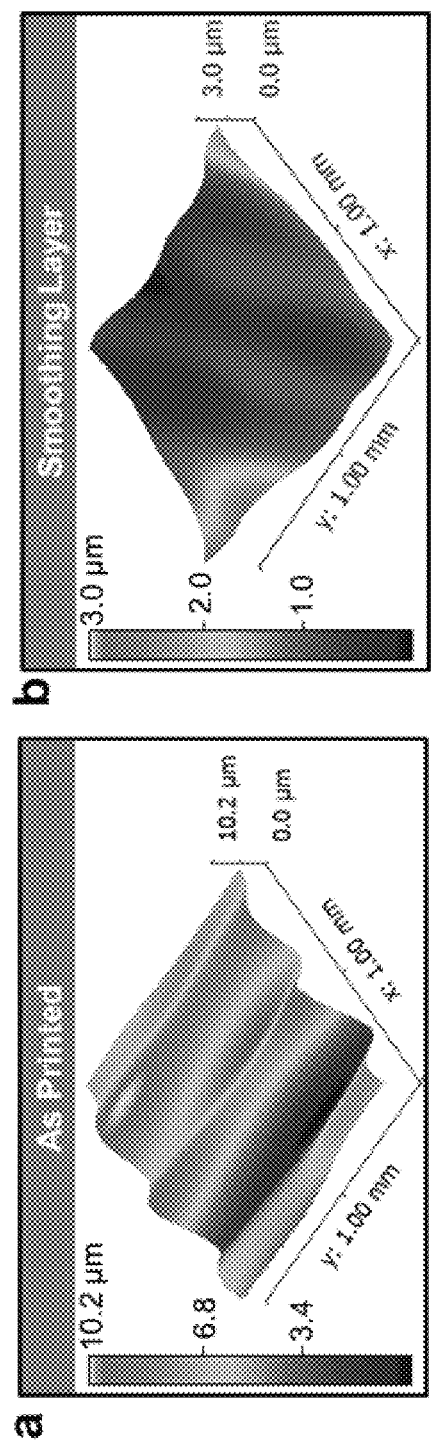
Fig. 15A
Fig. 15B

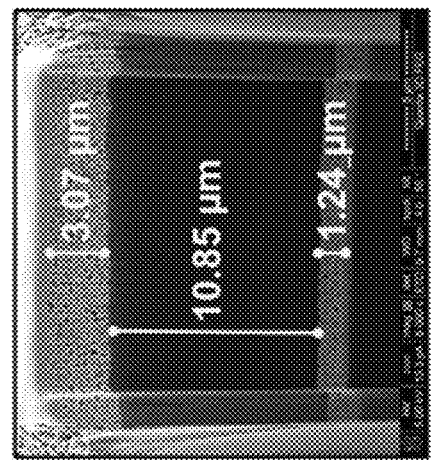
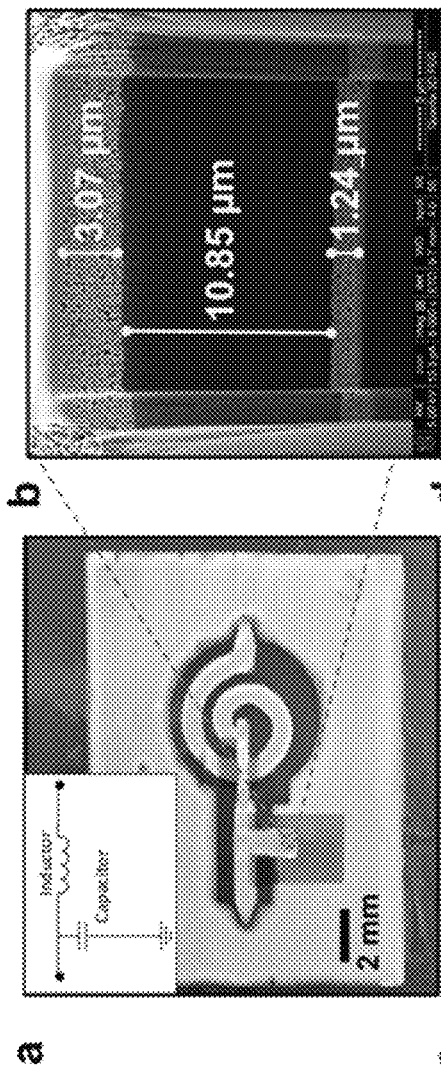
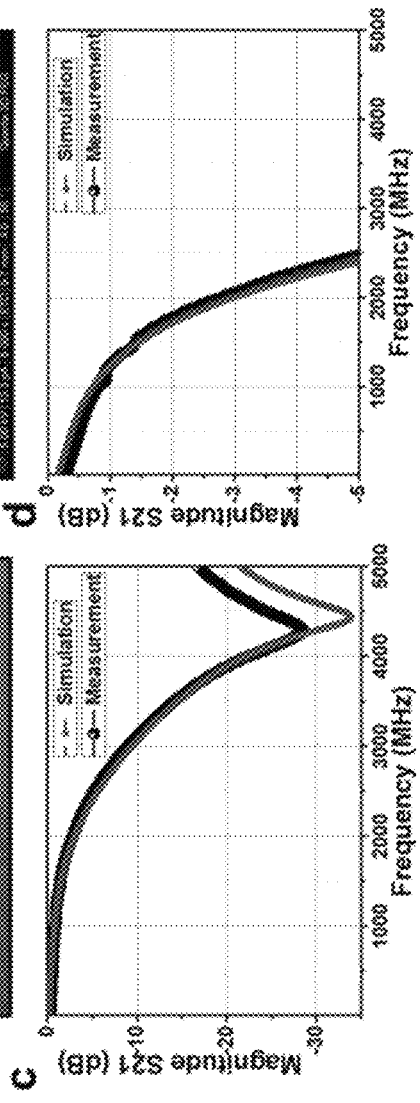
Fig. 18A  Fig. 18B  Fig. 18C  Fig. 18D

Table 1. Ink-formulation and its ink properties with different additives.

| Ink sample | Ink Mixing | Additive (0.5 ml) | Surface tension (mN/m) ±0.5 | Viscosity (Pa.s) ×10⁻³ | Jetting Performance | Adhesion test |
|---|---|---|---|---|---|---|
| A | | 2% HEC in water: methanol | 33.51 | 9.0 | No jetting | - |
| B | | 2,3 butanediol | 33.40 | 6.45 | Ink jetted successfully | Good, 4B |
| C | | Glycerol | 34.30 | 8.01 | Ink jetted successfully | Poor, 3B |
| D | | Ethylene glycol | 34.54 | 5.55 | Ink jetted successfully | Poor, 3B |
| E | | No additive | 33.08 | 4.95 | Ink jetted successfully | Good, 4B |
| F | | 2% 2-HEC (MW= 90,000) in water: metahnol | 30.7 | 5.97 | Ink jetted successfully | Excellent, 5B |

Fig. 19

SILVER-ORGANO-COMPLEX INK WITH HIGH CONDUCTIVITY AND INKJET STABILITY

CROSS-REFERENCE TO RELATED DOCUMENTS

This application is a Continuation of U.S. application Ser. No. 15/779,363, filed on May 25, 2018, which is a National Stage Application of application number PCT/IB2016/057592, filed on Dec. 13, 2016, which claims priority to, and incorporates by reference if fully set forth herein U.S. provisional application No. 62/267,096 filed Dec. 14, 2015 titled "Silver-Organo-Complex Ink with High Conductivity and Inkjet Stability".

TECHNICAL FIELD

The present disclosure generally relates to conductive inks for inkjet printing.

BACKGROUND

Currently, a silver nanoparticle based inkjet ink is commercially available. This type of ink has several serious problems such as a complex synthesis protocol, high cost, high sintering temperatures (~200° C.), particle aggregation, nozzle clogging, poor shelf life, and jetting instability. For the emerging field of printed electronics, these short comings in conductive inks are barriers for their wide spread use in practical applications.

SUMMARY

Provided herein are particle free conductive metal inks to address the aforementioned issues. In one or more aspects, particle free silver inks are provided that have high conductivity and inkjet stability. The inks can be formulated of a silver-organo-complex (SOC). The inks can include complexing molecules that act as reducing agents.

In one or more embodiments, an SOC ink composition is disclosed. The ink composition can comprise a silver salt and a complex of a first complexing agent and a second complexing agent and a carboxylic acid or a salt of a carboxylic acid. The silver salt can be selected from the group consisting of silver acetate, silver formate, silver carbonate, silver fluoride, silver nitrate, silver nitrite, silver chloride, silver bromide, silver iodide, silver phosphate, and silver oxide. The first complexing agent can be an alkyl amine. The alkyl amine can be selected from the group consisting of methylamine, ethylamine, propylamine, butylamine, and amylamine. The second complexing agent can be an amino alcohol. The amino alcohol can be selected from the group consisting of amino alcohols where in the alcohol is a C1-4 alcohol, such as methanolamine, ethanolamine, propanolamine, or butanolamine. The carboxylic acid can be selected from the group consisting of carbonic acid, formic acid, acetic acid, propionic acid, butyric acid and pentanoic acid, and salts thereof. In one or more aspects, the carboxylic acid can be a short chain carboxylic acid having a short chain of 1-3 carbon atoms, and salts thereof. The short chain carboxylic acid can be carbonic acid, formic acid acetic acid and/or propionic acid. The ink composition can further include one or more additives for use as an adhesive promoter. Suitable additives include 2% hydroxyethylcellulose (HEC), 2% 2-hydroxyethylcellulose and 2, 3 butanediol. A solvent can also be used to adjust the viscosity and/or surface tension of the ink composition. The solvent can be, for example, water or an alcohol. The alcohol can be a low chain alcohol or a substituted low chain alcohol. In one or more aspects, the low chain alcohol can have a short chain of 1-3 carbon atoms, i.e. methanol, ethanol, isopropanol, etc. The ink composition can have a pH of about 9 to about 14 and any pH in between. For example, the ink composition can have a pH of about 10.5. The ink composition can have a viscosity below 9 mPA·s, for example about 4.95 mPA·s to about 5.97 mPa·s and any viscosity in between. The ink composition can have a surface tension of about 30.7 mN/m to about 33.08 mN/m and any surface tension in between. The ink composition can have a sintering temperature of about 80 degrees Celsius to about 150 degrees Celsius and any temperature in between.

In one or more embodiments, a method of making the ink composition is provided. The method can include the steps of combining the aforementioned silver salt and first and second complexing agents and carboxylic acid or a salt of the carboxylic acid, to form an SOC ink composition of the present disclosure. The pH of the ink composition can be adjusted to a desired value, such as within the range of 9 to 14.

In one or more embodiments, a method of forming a silver structure with the aforementioned ink is provided. The method can comprise the steps of loading an ink composition into a container, placing the container into an ink deposition device (such as a printer with a nozzle and a means to load the ink into the nozzle), depositing the ink composition onto a surface, and reducing the ink composition that was deposited. The ink composition can be used for on-demand fabrication of the silver structure. The silver structure can be a radio frequency (RF) electronic device. The RF electronic device can be an RF inductor, capacitor and/or filter. The ink can be deposited with an about 1 pL piezoelectric nozzle of an ink deposition device to an about 10 pL piezoelectric nozzle of an ink deposition device, and a nozzle of an ink deposition device can deposit a volume of about 1 pL to about 10 pL. The ink composition can be deposited on a substrate, such as polyimide (PI), polyethylene terephthalate (PET), polyethylene naphthalate (PEN), or glass.

Other systems, methods, features, and advantages of the present disclosure will be or become apparent to one with skill in the art upon examination of the following drawings and detailed description. It is intended that all such additional systems, methods, features, and advantages be included within this description, be within the scope of the present disclosure, and be protected by the accompanying claims.

BRIEF DESCRIPTION OF THE DRAWINGS

Many aspects of the disclosure can be better understood with reference to the following drawings. The components in the drawings are not necessarily to scale, emphasis instead being placed upon clearly illustrating the principles of the present disclosure. Moreover, in the drawings, like reference numerals designate corresponding parts throughout the several views.

FIGS. 6A-6H are cross-sectional SEM images of as-printed silver film on glass (FIGS. 6A-D) and PEN (FIGS. 6E-H) substrate with number of printing layers.

FIGS. 10A-10D depict (A) Viscosity of VeroWhite™ dielectric ink (B) TGA of VeroWhite™ material after UV curing (C) dielectric constant properties of VeroWhite™ material after UV curing (D) dissipation factor. Bars represent the maximum and minimum measurement values of five test samples with the parallel plate method Agilent E4991 and dielectric test fixture 16453A.

FIGS. 12A-12D are cross section focused ion beam and SEM profiles of a printed silver film of the present disclosure; and FIGS. 12E and 12H are SEM images of the corresponding surfaces.

FIG. 14 shows contact angle measurements showing the effect of perfluorodecanethiol treatment on the spreading of the dielectric ink on top of a solid printed silver layer at 5, 10 and 20 minutes, as compared for no treatment.

FIGS. 15A and 15B depict (A) white light interferometer of the 3D printed part with 1.8 μm in RMS roughness and (B) after a smoothing layer of acrylic dielectric ink is applied with 0.4 μm in RMS roughness, respectively.

FIGS. 18A-18D (A) microscope image of the printed filter, (B) SEM focused ion beam cross-section image through the capacitor area, showing the thickness of the printed dielectric and the top and bottom electrodes of the filter, (D) measured and simulated S$_{21}$ filter response versus frequency, and (D) zoomed in view of the filter response.

FIG. 19 shows Table 1. Ink-formulations A-F and ink properties with different additives.

DETAILED DESCRIPTION

Figure 1A:
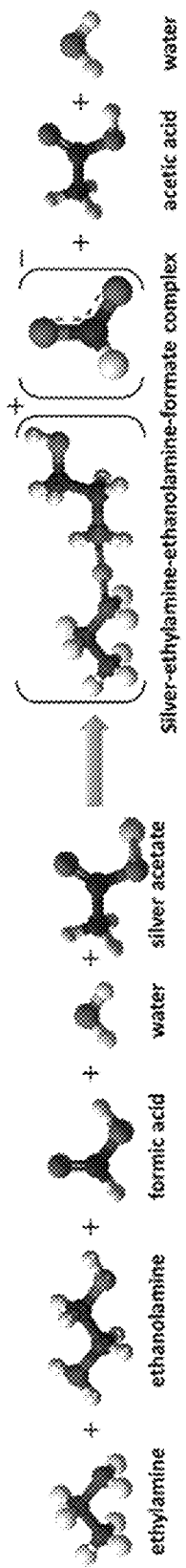
FIG. 1A depicts an illustrative procedure for the formulation of silver-ethylamine-ethanolamine-formate-complex based silver-organic-complex (SOC) ink and the chemical reaction involved in the formulation of ink.

Described herein are various embodiments of the present systems and methods for our SOC ink. Although particular embodiments are described, those embodiments are mere exemplary implementations of the system and method. One skilled in the art will recognize other embodiments are possible. All such embodiments are intended to fall within the scope of this disclosure. Moreover, all references cited herein are intended to be and are hereby incorporated by reference into this disclosure as if fully set forth herein. While the disclosure will now be described in reference to the above drawings, there is no intent to limit it to the embodiment or embodiments disclosed herein. On the contrary, the intent is to cover all alternatives, modifications and equivalents included within the spirit and scope of the disclosure.

Discussion

Before the present disclosure is described in greater detail, it is to be understood that this disclosure is not limited to particular embodiments described, as such may, of course, vary. It is also to be understood that the terminology used herein is for the purpose of describing particular embodiments only, and is not intended to be limiting, since the scope of the present disclosure will be limited only by the appended claims.

Where a range of values is provided, it is understood that each intervening value, to the tenth of the unit of the lower limit (unless the context clearly dictates otherwise), between the upper and lower limit of that range, and any other stated or intervening value in that stated range, is encompassed within the disclosure. The upper and lower limits of these smaller ranges may independently be included in the smaller ranges and are also encompassed within the disclosure, subject to any specifically excluded limit in the stated range. Where the stated range includes one or both of the limits, ranges excluding either or both of those included limits are also included in the disclosure.

Unless defined otherwise, all technical and scientific terms used herein have the same meaning as commonly understood by one of ordinary skill in the art to which this disclosure belongs. Although any methods and materials similar or equivalent to those described herein can also be used in the practice or testing of the present disclosure, the preferred methods and materials are now described.

All publications and patents cited in this specification are herein incorporated by reference as if each individual publication or patent were specifically and individually indicated to be incorporated by reference and are incorporated herein by reference to disclose and describe the methods and/or materials in connection with which the publications are cited. The citation of any publication is for its disclosure prior to the filing date and should not be construed as an admission that the present disclosure is not entitled to antedate such publication by virtue of prior disclosure. Further, the dates of publication provided could be different from the actual publication dates that may need to be independently confirmed.

As will be apparent to those of skill in the art upon reading this disclosure, each of the individual embodiments described and illustrated herein has discrete components and features which may be readily separated from or combined with the features of any of the other several embodiments without departing from the scope or spirit of the present disclosure. Any recited method can be carried out in the order of events recited or in any other order that is logically possible.

Embodiments of the present disclosure will employ, unless otherwise indicated, techniques of chemistry, synthetic inorganic chemistry, analytical chemistry, and the like, which are within the skill of the art. Such techniques are explained fully in the literature.

It is to be understood that, unless otherwise indicated, the present disclosure is not limited to particular materials, reagents, reaction materials, manufacturing processes, or the like, as such can vary. It is also to be understood that the terminology used herein is for purposes of describing particular embodiments only, and is not intended to be limiting. It is also possible in the present disclosure that steps can be executed in different sequence where this is logically possible.

It must be noted that, as used in the specification and the appended claims, the singular forms "a," "an," and "the" include plural referents unless the context clearly dictates otherwise. Thus, for example, reference to "a support" includes a plurality of supports. In this specification and in the claims that follow, reference will be made to a number of terms that shall be defined to have the following meanings unless a contrary intention is apparent.

DISCLOSURE

The field of printed electronics deals with several kinds of conductive inks, including nanoparticles, nanowire, and two-dimensional sheets, which are based on metal, silicon, carbon, and oxide semiconductors.[1-7] However, the printed electronics market is currently dominated by conductive metal nanoparticle based inks. The fabrication of high quality and low cost electronics requires innovative ink formulations that are cheaper and faster than traditional production methods. At present, most of the conductive inks available are based on silver nanoparticles.[8-12]

As a requirement, ink must be stable to aggregation and precipitation to achieve reproducible performance. To meet this requirement silver nanoparticle ink normally uses organic stabilizers; unfortunately the stabilizers also can act as insulators.[12] Moreover, silver nanoparticle ink with a high solid content can be more prone to stability issues, which can result in clogging of the inkjet nozzles and concerns about shelf-life of the ink.[13] High silver loading can be beneficial, but the high temperature removal of organic stabilizers from the nanoparticles can limit the choice of the substrate. Several sintering techniques (e.g. intense pulsed light, UV-curing[14], microwave[15], photonic[16], and laser curing[17]) have been reported to lower the sintering temperature, while remaining compatible with polymer substrates. Although these methods can be suitable alternatives, they have the disadvantage of requiring high temperatures for the thermal sintering. Fortunately, there is room for tuning the ink chemistry to reduce the temperature.[8]

Compared to nanoparticles, metal-organo complex based ink has recently received attention as a potentially lower cost alternative that can be stable at concentrations approaching saturation; neither additional stabilizers nor reducing agents are required.[18-19] Inkjet printing with the use of particle free metal-organic-complexes or salts of various metals is a low-cost technology for direct metallization.[20] By adjusting the viscosity and surface tension of the solution complex ink-chemistry, this type of ink could be used for various deposition techniques (e.g., spin-coating, direct ink writing, fine nozzle printing, airbrush spraying, inkjet-printing, screen printing, and roll-to-roll processing methods) in order to fabricate conductive tracks. A silver salt (20 wt % silver) solution in methanol/anisole (ink purchased from TEC-IJ-040, InkTec Co., Ltd, Korea) was utilized by Perelaer et al.[21] Their study demonstrated that printed silver tracks on glass have a conductivity of $1.2\text{-}2.1 \times 10^7$ S/m at 150° C.

Reactive silver inks, including ammonium hydroxide as a complexing agent and formic acid as a reducing agent, have been reported by Walker et al.[22] Such a reactive ink decomposes too quickly, however, even at room temperature. Thus, it may not be suitable for long-term inkjet printing processes because it may lead to the formation of silver particles in the nozzle and clog it. In addition, fast vaporization of ammonia and carbon dioxide during the heating process can lead to gas bubbles. These gas bubbles from the vaporization of the silver ink components could drastically decrease the quality of the silver film and interfere with adhesion of the silver to the substrate. Despite these possible drawbacks, this ink possessed a conductivity at 90° C., which is almost equivalent to that of bulk silver.

A similar ink has been tested by Liu et al.[23] using laser direct patterning of silver film on polymer substrate. Chen et al.[24] spin-coated Ag(dien)](tmhd)/hexylamine/ethyl cellulose based ink on a PI substrate, and then annealed it at 250° C. for three hours; they obtained a conductivity of 1-2.1×10$^7$ S/m depending on film thickness. Recently, Dong et al.[25] synthesized MOC ink through a two-step process. First, silver oxalate was synthesized by silver nitrate and then dissolved in ethylamine as a complexing ligand, with ethyl alcohol and ethylene glycol as a solvent, using a low temperature (0° C.) mixing process. The printed patterns on the PI substrate that were cured at 150° C. for 30 minutes showed metalized silver with a conductivity of 1.1×10$^7$ S/m.

The methods described above for formulating silver complex based ink suffer from several drawbacks. In some cases a multi-component solvent in the ink can have negative effects, and the ink can be less stable with poor electrical properties and film formation even at high-temperature annealing. In most of the reported SOC inks, adhesion with the substrate is either not provided or discussed and jetting stability is not examined. For commercial utility, the design of silver complexation should meet the various requirements such as in situ reduction, optimal viscosity, storage & jetting stability, smooth uniform sintered films, and high conductivity. In the field of printed electronics, like other emerging electronic technologies, new materials and processing methods are required for their ever-improving development and performance.

Disclosed herein is a novel SOC ink to address the aforementioned disadvantages and shortcomings of previous inks. In any one or more aspects, an ink composition for making a silver structure is provided. The ink composition can comprise: a silver salt; an organo-complex of a first complexing agent and a second complexing agent; and a carboxylic acid or a salt of the carboxylic acid. The first complexing agent can be an alkyl amine. The alkyl amine can be selected from the group consisting of methylamine, ethylamine, propylamine, butylamine, or amylamine. The second complexing agent can be an aminoalcohol. The aminoalcohol can be selected from the group consisting of methanolamine, ethanolamine, propanolamine, or butanolamine. The carboxylic acid can be carbonic acid, formic acid, acetic acid, propionic acid, butyric acid, pentanoic acid, a salt thereof, or any combination thereof. In one or more aspects, the carboxylic acid can be a short chain carboxylic acid, i.e. having 1-3 carbon atoms, such as carbonic acid, formic acid, acetic acid, propionic acid, a salt thereof, and any combination thereof.

In any one or more aspects, the ink composition can include a solvent and/or a stabilizer. The solvent can be water an alcohol, and a combination thereof. The alcohol can be a short chain alcohol having an alkyl chain of 1-3 carbon atoms. The ink composition can have has a pH of 9-14, for example an adjusted pH of about 10.5. The ink composition ink can include an additive to promote adhesion. The additive can be selected from the group consisting of HEC, 2-HEC, 2,3-butanediol, glycerol, or ethylene glycol. As an example, the additive can be about 2% 2-HEC. The ink composition can have a viscosity of less than 9 mPa·s, for example about 4.95 mPa·s to about 5.97 mPa·s. The ink composition can have a surface tension of about 30.7 mN/m to about 33.08 mN/m. The ink composition can have a sintering temperature of about 80 degrees Celsius to about 150 degrees Celsius. In an aspect, the present ink can be a silver-ethylamine-ethanolamine-formate-complex based transparent and stable ink. The ethylamine, ethanolamine, and formate species can act as in situ complexing solvents and reducing agents. The as-formulated ink composition can be inkjet printed on a wide range of substrates, including (but not limited to) PI, PET, PEN, glass, and other 3D-printed substrates, such as those formed from acrylic and/or molten plastic (acrylonitrile butadiene styrene (ABS), polylactic acid (PLA), etc) based materials. By adjusting the viscosity and surface tension of the ink composition, the ink can be used for various ink deposition techniques, including spin coating, direct ink writing, fine nozzle printing, airbrush spraying, screen printing and roll-to-roll processing methods.

Decomposition of the ink (i.e., the process of solvent evaporation with heat after the ink is jetted from a nozzle onto a target substrate surface) in the present disclosure can lead to uniform surface morphology with excellent adhesion to the substrates. The jetting and storage stability can be monitored, and the inks can be highly stable with jetting for repeated performance. The ink can have high conductivity. Combining these characteristics with the high conductivity of the ink, fabricated RF electronic devices can be printed which can demonstrate suitable performance. For example, Inductor values can be realized up to 35 nH with quality factors greater than 10 at frequencies above 1.5 GHz and can prove the viability of the ink as a suitable material for the fabrication of printed electronics.

EXAMPLES

The following examples are put forth so as to provide those of ordinary skill in the art with a complete disclosure and description of how to perform the methods and use the compositions and compounds disclosed and claimed herein. Efforts have been made to ensure accuracy with respect to numbers (e.g., amounts, temperature, etc.), but some errors and deviations should be accounted for. Unless indicated otherwise, parts are parts by weight, temperature is in ° C., and pressure is in bar. Standard temperature and pressure are defined as 0° C. and 1 bar.

Example 1

Ink Chemistry

The as-formulated ink can be free of particles and can be stable in a sealed glass vial at room temperature. Storage stability can be extended, however, if the ink is stored in an opaque vial and refrigerated at 4° C. The ink can be prepared through the complexation between the silver salt, in this example silver acetate, pH controlled complexing solutions, and a short chain carboxylic acid which in this example is formic acid. The complexing solutions in this example contained ethylamines and ethanolamines as the first and second complexing agents, acetate anions from the silver acetate in solution, and formate anions from the formic acid.

Figure 1B:
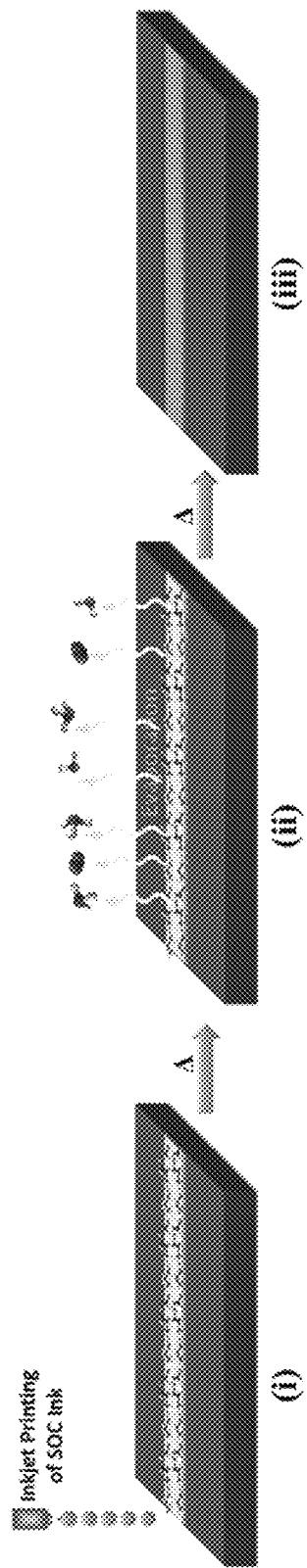
FIG. 1B depicts a schematic presentation of a thermal reduction process for printed ink conversion to silver metallic phase and chemical reaction represented by ball-and-stick model.

The lone pairs of electrons on the nitrogen atoms of ethylamine and ethanolamine can coordinate with silver cations from the silver salt and they may form Ag(ethylamine-ethanolamine) complexes that can be balanced with the formate anions (FIG. 1A). Usually, silver-amines complexes can have very high solution pH (for example, pH=14 or higher) and could not be used for effective ink reduction and decomposition, but with the addition of formic acid and adjustment of solution pH below 14, in this example to 10.5, the resultant ink can have suitable stability and decomposition at elevated temperature. An ink composition with a of pH 10.5 can provide suitable chemical stability. However, further reduction of the solution pH (for example, below 9) may lead to instability and lower silver loading. Thus, in some instances both amine combinations may be necessary not only for chemical stability but also for its decomposition at lower temperature with high conductivity. As the ink is heated above 80° C., elemental silver can be the only phase that remains. Pure elemental silver can result from the decomposition and reduction of complexes by the formate anion, which can lead to the slow evaporation of ammonia and carbon oxide along with the low boiling point reactants (FIG. 1B).

Several additives were investigated that can promote adhesion, such as 2% hydroxyethylcellulose (HEC), 2% 2-HEC, 2,3-butanediol, glycerol, ethylene glycol. It is observed that even without any additive, the ink can possess good adhesion on substrates and can have good jetting and storage stability. With the addition of an adhesive promoter like cellulose (i.e. 2-HEC or HEC), the ink can show excellent adhesion as compared to glycol-based additive or no additive. See Table 1 (FIG. 19).

Several additives were investigated that can promote adhesion, such as 2% hydroxyethylcellulose (HEC), 2% 2-HEC, 2,3-butanediol, glycerol, ethylene glycol. It is observed that even without any additive, the ink can possess good adhesion on substrates and can have good jetting and storage stability. With the addition of an adhesive promoter like cellulose (i.e. 2-HEC or HEC), the ink can show excellent adhesion as compared to glycol-based additive or no additive. See Table 1 (FIG. 19).

It is well documented that cellulose based molecules can possess self-adhesion. Several theories have been proposed to provide an explanation for the adhesion phenomenon such as: adsorption, electrostatic attraction, and diffusion; however, there is currently no single theory that can explain adhesion in general, as has been discussed in literature.[26] Further discussion on nanoparticle based film's adhesion to substrates through adhesion promoters can be found in references below.[27,28]

As can be seen, the adhesion enhancement phenomenon due to promoters is a complex issue and can be explained based on multiple theories. In the present case, an explanation can be that the ink with promoter (additive) shows good wettability on the substrate, and it could be presumed that the physical adsorption due to van der Waals attraction force and acid-base interactions is contributing to the adhesion forces. It was realized that water compatible (HEC) can be a choice for the present ink-formulation even with 2% wt, and can provide sufficient viscosity. All of the ink can be jetted successfully, except for ink with 2% HEC. It is observed that even at high voltage with an efficient waveform the fluid can be driven out of the orifice but then can recoil back inside. 2-HEC (MW-90000) also can exhibit excellent jetting behavior.

Thermal Analysis of Ink

Figure 2A:
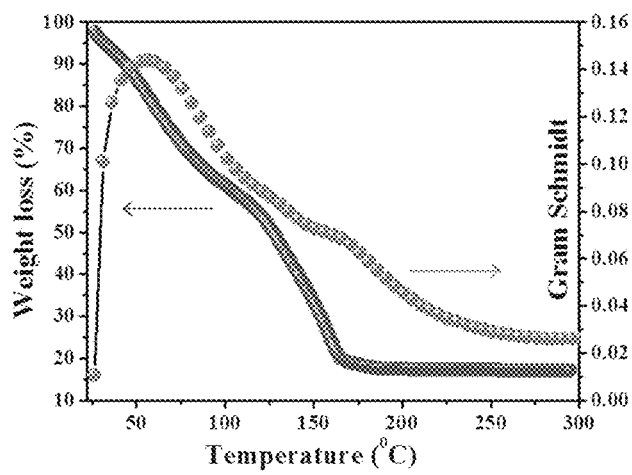
FIG. 2A depicts thermogravimetric analysis (TGA) of the SOC ink.
Figure 2B:
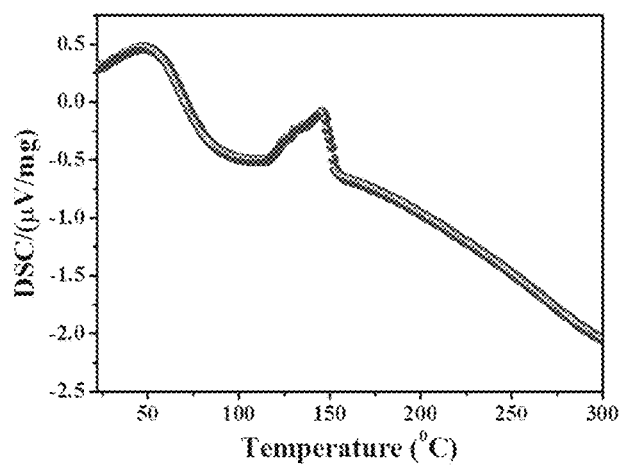
FIG. 2B depicts differential scanning calorimetry (DSC) analysis of the SOC ink.
Figure 2C:
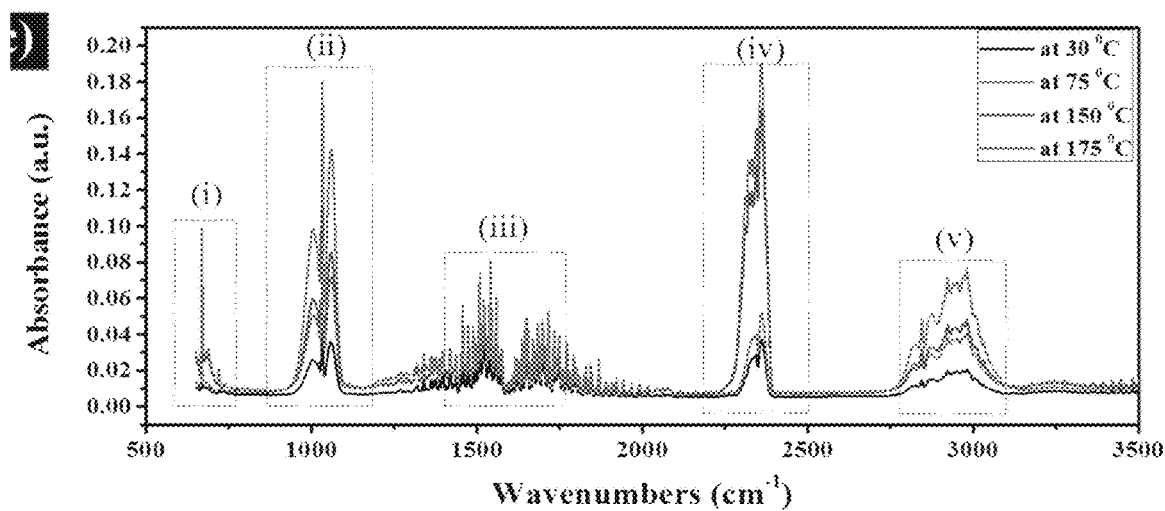
FIG. 2C depicts Fourier transform-infrared (FT-IR) spectrum for in situ gas evolution during thermal decomposition.

The thermal decomposition of the ink and the Fourier transform-infrared (FT-IR) spectra of gas evolution during the process can be determined using a thermogravimetric analysis infrared (TGA-IR). TGA and DSC analysis can be performed on the SOC ink. FIGS. 2A, 2B and 2C show the TGA and Gram-Schmidt curves, differential scanning calorimetry (DSC) curve, and FT-IR spectrum scans (for in situ gas evolution during thermal decomposition) of the SOC ink, respectively.

Storage and Jetting Stability of Ink

Figure 3A:
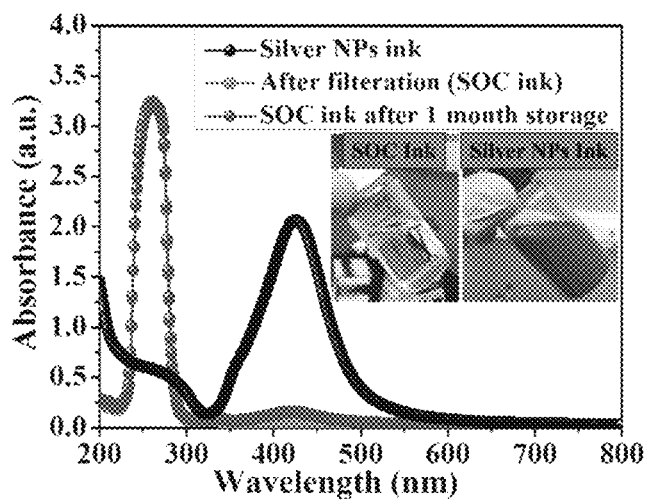
FIG. 3A depicts ink-storage monitored by ultraviolet-visible (UV-Vis) spectrophotometer. The inset in FIG. 3A shows a photographic image of an SOC ink sample and a comparison with nanoparticle based ink (Silverjet DGP-40LT).

Particle free ink can be formulated which may not aggregate or clog during printing. The ink can provide both jetting stability and long term storage. The ink storage stability can be monitored using a UV-Vis spectrophotometer. Absorption spectra from SOC ink one month after storage, filtered SOC ink, and Silver nanoparticle (NP) reference ink are shown in FIG. 3A. The absorption spectra from inks are featureless. Moreover, the absorption spectra shows weak absorption in the 400-425 nm range, where absorption is typically associated with the presence of silver particles (0.1% DGP-40LT silver NPs ink). This finding confirms that the ink was particle-free. After one month of storage, there was no sign of silver formation in the UV spectrum and the ink remained transparent. Rheological measurement of the ink was also examined for freshly prepared ink and after two to three weeks of storage corroborated a lack of silver particle formation.

The graphs show that there is no substantial change in viscosity with storage time (2 to 3 week) when applying shear rate of 0.1-1200 1/s. To provide further insight with storage and jetting stability, the evaporation rate of the ink can be investigated by thermogravimetric analysis. The ink can be kept at different isothermal temperatures i.e. 28, 80 and 150° C. for a period of time of two hours in constant air flow (20 mL/min) environment. However, it is worth mentioning here that these test conditions may not be a true representation of the ink in the cartridge, where ink may not be very exposed and may not have an operating cartridge temperature of more than 60° C. As expected, the evaporation rate of the solvents at 28° C. can be much slower than the solvent evaporation rate at 80° C. and 150° C. More than 50% of the ink constituent can retain over the period of 6 h at 28° C. However, when the isothermal temperature is increased to about 80° C. and about 150° C., ink solvents can evaporate completely with faster rates (150° C. within about 30 min and 80° C. in about 2 h). It could be assumed that complete evaporation at 80° C. needs more time than usual.

Apart from ink storage stability, it can be important to investigate the ink's jetting stability with time using a conventional 10 pL nozzle as well as with a 1 pL nozzle. Evaporation of the ink in the nozzle can lead to clogging of the head as well as a decrease in drop mass over time. There are several reports[22-25] where authors have presented particle free ink-formulations, but none report jetting stability over time. If the ink is very reactive, such as silver-amino complex based reactive ink that can decompose even at room-temperature, then there is a chance of the ink drying in the nozzle.[22]

Figure 3B:
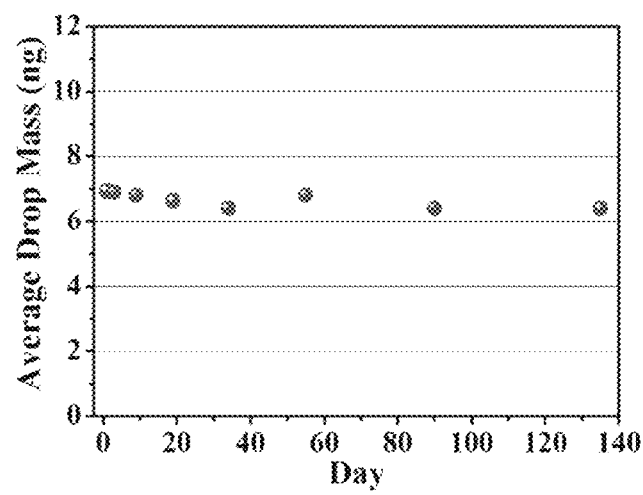
FIG. 3B depicts ink-jetting stability for a 10 pL cartridge monitored by evaluating average drop mass with number of days.

However, in our ink formulation low and high boiling amines not only complex with silver, they can act as a co-solvent to suppress the evaporation rate. Methanol can be added to adjust the surface tension (30.7±0.5) of the ink, which is almost stable over a time, and thus can stabilize the ink performance. Ink storage can be monitored by ultraviolet-visible (UV-vis) spectrophotometry for a 10 pL cartridge can be monitored, as demonstrated in FIG. 3A. Ink-jetting stability can also be measured, and FIG. 3B shows a graph of the average drop mass monitored over 5 months for 10 pL nozzles, which can be fairly consistent at just under 7 ng. The nozzles with 1 pL also show consistent average drop mass of less than 1.25 ng over 3 week time. The ink can be kept in a refrigerator at 4° C. for storage. The inset in FIG. 3A shows a photographic image of an ink sample and its comparison with nanoparticle based ink (Silverjet DGP-40LT). Jetting stability tests can confirm that the ink can be highly stable with jetting for repeated performance.

Figure 3C:
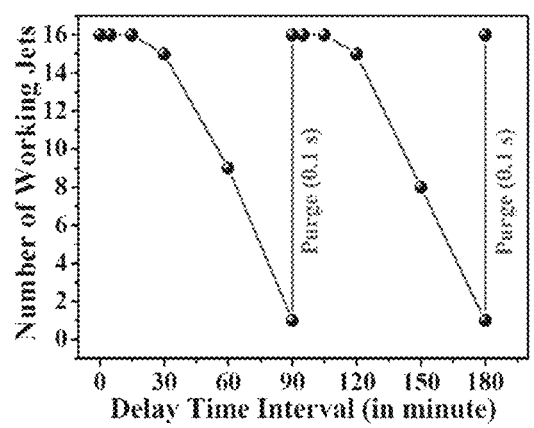
FIG. 3C number of working jets with delay time interval.

The effect that delay time interval has on the number of working jets was also investigated, as presented in FIG. 3C. The number of working nozzles means that when the delay test starts, there can be 16 total nozzles available to jettison the ink, with a print volume per each of the 16 nozzles in the range of 1 pL to 10 pL (in, for example, a piezoelectric based inkjet printer, such as a Dimatix DMP-2831 printer), which drop the ink continuously. With every delay time interval, nozzles are paused and re-played and the working ability of the nozzles is assessed. Up to 30 minutes of delay, almost all the nozzles worked well. As the delay time interval increases from 30 to 60 mins, the number of working nozzles dropped from 16 to a total of 9, which further dropped to 1 after a 90 min delay. Most of the nozzles stop working after a 90 min delay and the likely reason is the evaporation of ink in the nozzle. However, after 0.1 s purge, all 16 nozzles can again restart and follow the same delay trends. This may not be an issue in an industrial printing environment, because after a short purge (0.1 seconds), all jets can return to the initial working state. Interestingly, a delay test with 1 pL nozzles can show much better performance than 10 pL nozzles. With 1 pL nozzles and up to 180 minutes of delay, only 2 nozzles stopped working and rest of the nozzles can work perfectly. The reason is obvious as due to less opening of nozzle compared to 10 pL nozzles (9 μm), evaporation of ink can be much restricted in the nozzle.

Figure 4A:
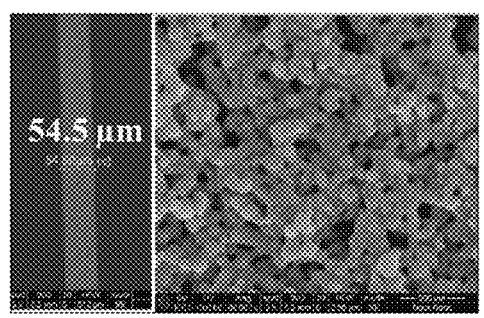
FIG. 4A depicts an inkjet-printed line pattern of SOC ink on glass and a corresponding scanning electron microscope (SEM) image.
Figure 4B:
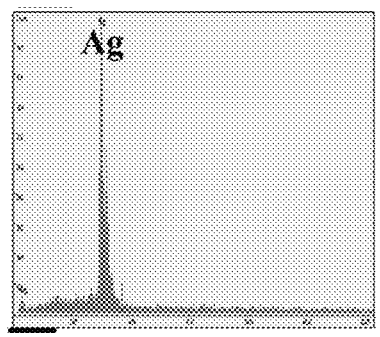
FIG. 4B depicts the corresponding energy-dispersive X-ray spectroscopy (EDS) analysis of the line in FIG. 4A.
Figure 4C:
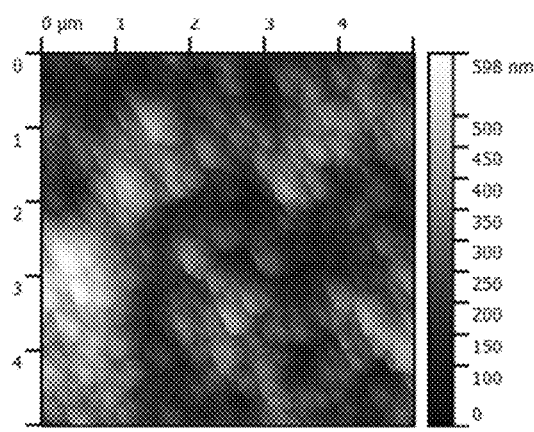
FIG. 4C depicts surface atomic force microscopy (AFM) topography for FIG. 4A.
Figure 4D:
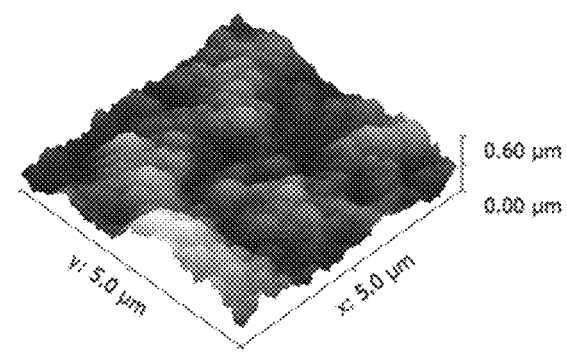
FIG. 4D depicts 3D AFM topography for FIG. 4A.
Figure 4E:
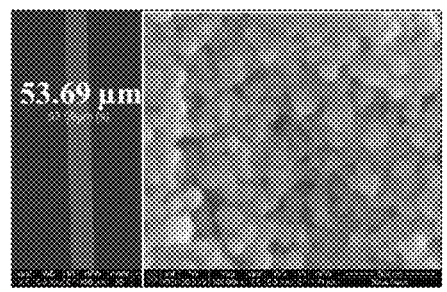
FIG. 4E depicts an inkjet-printed line pattern of SOC ink on PEN and a corresponding SEM image.
Figure 4F:
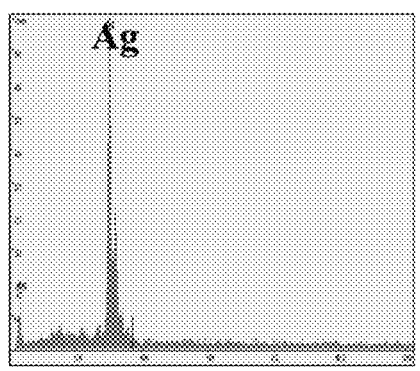
FIG. 4F depicts the corresponding EDS analysis of the line in FIG. 4E.
Figure 4G:
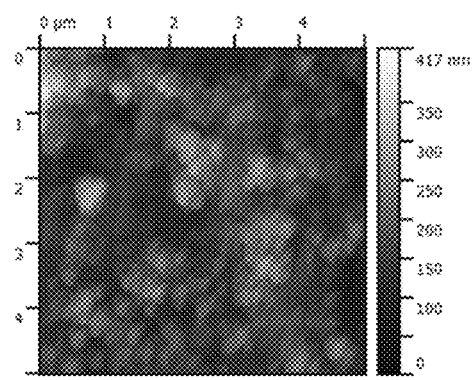
FIG. 4G depicts surface AFM topography for FIG. 4E.
Figure 4H:
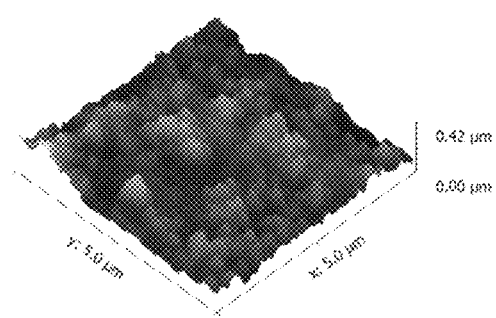
FIG. 4H depicts 3D AFM topography for FIG. 4E.
Figure 4I:
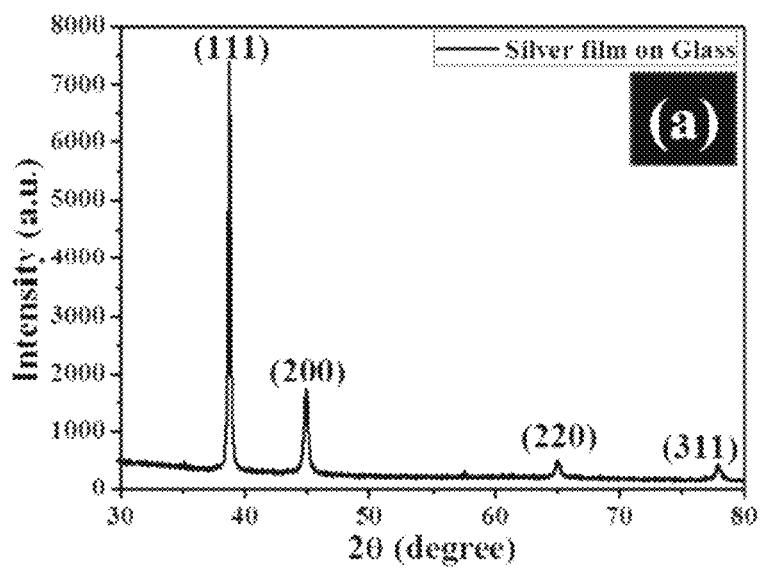
FIGS. 4I and 4J depict X-ray diffraction graphs for SOC based inks printed on (1) glass and (J) PEN substrate, respectively. The samples were sintered at 150° C./30 min.
Figure 4J:
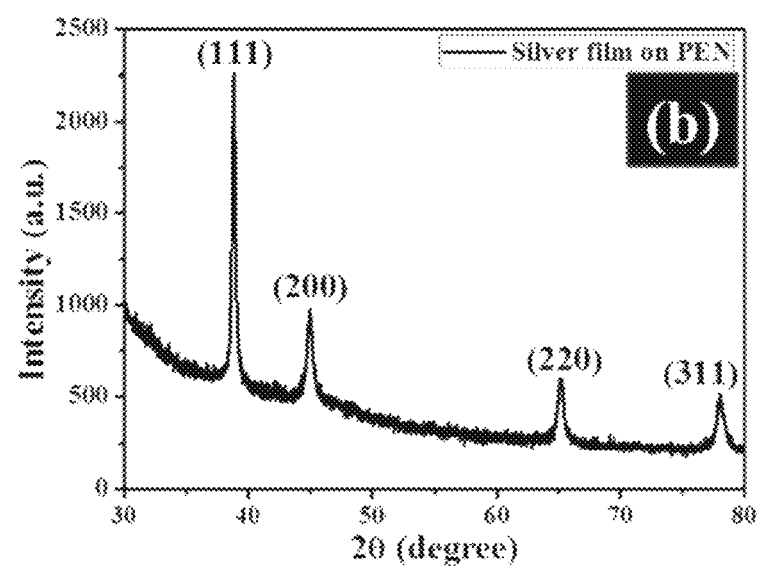

Morphological & Electrical Evolution of Printed Silver Film as a Function of Thermal Sintering FIGS. 4A-4H show scanning electron microscopy (SEM), energy-dispersive X-ray spectroscopy (EDS) analysis, and atomic force microscopy (AFM) images of SOC ink printed on glass (FIGS. 4A-4D) and PEN (t=125 μm, FIGS. 4E-4H) substrate. The images show that as-sintered particles can interconnect with each other and satisfy a three-dimensionally interconnected conduction pathway via inter-particle neck growth with a sintering temperature of 150° C./30 min. The printed silver line on the glass can have a line width of ~54 μm (FIG. 4A). The EDS spectrum demonstrated that the as-sintered films can be made of silver only without any impurities (FIG. 4B). AFM topography of the printed film shows that as-sintered films can be densified without any structural defects, and can have a root-mean-square (RMS) roughness of ~94.7 nm (FIGS. 4C & 4D). In contrast to printing on glass, the silver line width of ~53 μm on PEN can have less connected smaller particles with silver as an elemental phase (FIGS. 4E and 4F) and with a roughness of ~44.5 nm (FIGS. 4G-4H). FIGS. 4I and 4J show X-ray diffraction graphs of the printed films on glass and PEN substrates, respectively. The observed diffraction peaks are well matched and indexed to face-centered cubic silver (JCPDS NO. 04-0783).[32] The strong and sharp peaks indicate that the silver films can be highly crystalline and sintered.

Figure 5A:
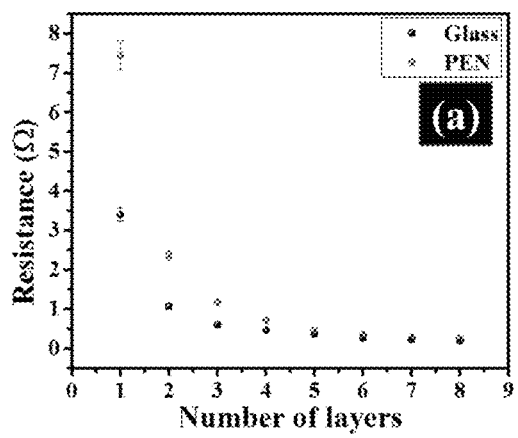
FIG. 5A depicts the resistance of 5×0.25 mm printed lines as a function of printed layers.
Figure 5B:
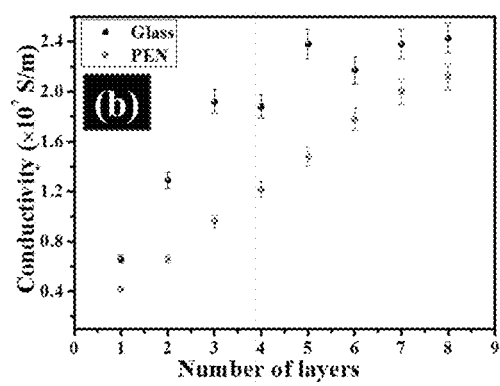
FIG. 5B shows calculated conductivity as a function of overprints.
Figure 5C:
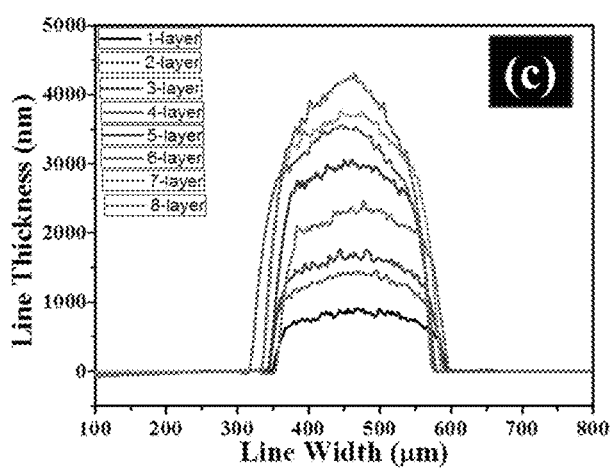
FIG. 5C depicts profiles of printed lines versus printed layers on a glass substrate.
Figure 5D:
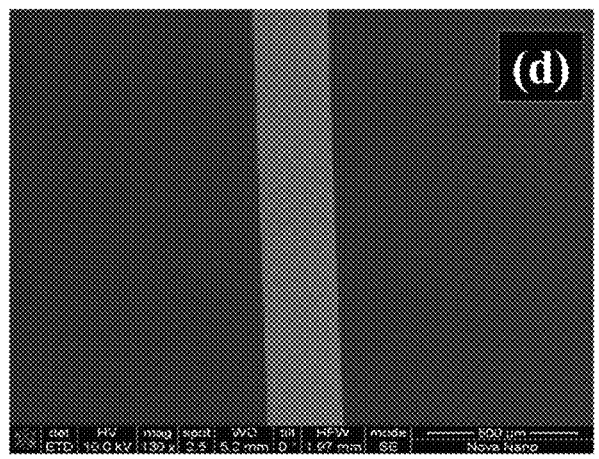
FIG. 5D depicts an SEM image of a printed line on glass after being sintered.
Figure 5E:
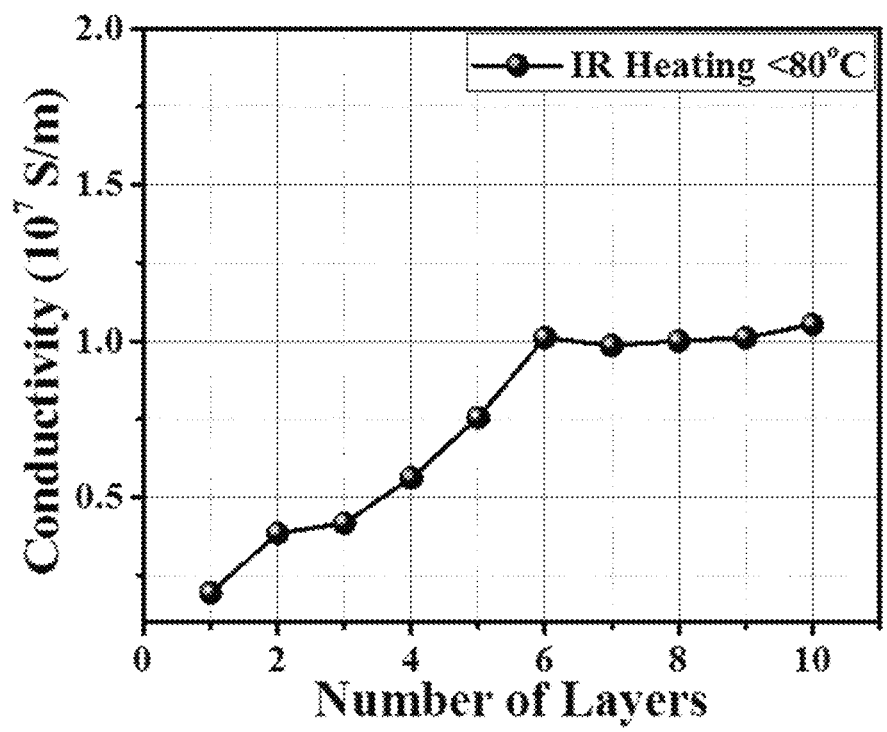
FIG. 5E depicts conductivity as a function of overprints on a 3D printed substrate.

To evaluate the electrical performance of SOC ink on glass and PEN substrate, 5×0.25 mm electrode lines can be printed as a function of the over-printing number. Sintering can be performed at 150° C. for 30 minutes after printing each layer. FIGS. 5A and 5B show graphs illustrating 4-point DC probe measured resistance (FIG. 5A) and calculated electrical conductivity (FIG. 5B) as a function of the number of over-printing layers on both glass and PEN substrates. FIGS. 5C and 5D show width scan profile graphs and an SEM image of the printed lines. The thickness of printed electrodes can increase in a fairly linear manner with the number of printed layers. Initially, single printing demonstrated conductivities of ~0.66×10$^7$ and ~0.4×10$^7$ S/m on glass and PEN can be obtained respectively. Differences in conductivity on different substrates are frequently observed.[33,34] FIG. 5E shows a graph illustrating 4-point DC probe measured electrical conductivity as a function of the number of over-printing layers on 3D printed substrate (Vero Ink, Stratasys Objet printer). The 3D printed substrate can be chosen because of its low glass transition temperature (~50° C.). The AOC ink can provide a suitable 1×10$^7$ S/m, (20%) of bulk conductivity at only 80° C. using a low cost IR lamp. It is interesting to note that, usually, nanoparticle-based silver ink may not show any conductivity at this processing temperature.

To investigate the conductivity difference on glass (FIGS. 6A-6D) and PEN (FIGS. 6E-6H) substrates, cross-sectional SEM images were checked and it can be observed that the first layer of the printed film on PEN substrate has not been sintered well, as nano-particles in the underlying layer can be clearly seen (marked with an arrow in FIGS. 6E-6H). This may be attributed to the lower thermal conductivity of PEN as compared to the glass substrate. However, with the amount of over-printing the conductivities of the printed structure can substantially be increased. With single printing and sintering, due to the presence of voids between the films, percolated conductive pathways may be limited. Because the ink can be particle free and can have a liquid-like behavior, when it was over-printed on sintered film it can go deep into the film and fill the voids after sintering and enhance three-dimensional interconnection. Cross-sectional SEM images of over-printed lines on glass and PEN substrates can show that the voids in the film may be filled (see, FIGS. 6A-6H).

With printing numbers of seven to eight, the conductivity can saturate at ~2.43×10$^7$ and ~2.12×10$^7$ S/m on glass and PEN, respectively. The previously reported reactive silver ink[22] can have higher conductivity as highlighted in Supporting information, Table 2. Table 2 compares the performance properties of several other SOC and nanoparticle inks and considering all requirements on jetting stability, adhesion, and storage, this SOC ink can distinguishes itself from other works.

TABLE 2

A comparison of conductivities obtained using various silver inks

| *Silver Ink Type | Adhesion Test | Method of deposition | *Jetting Stability test | Sintering Temperature (° C.)/Time (in minute) | Conductivity (S/m) × 10$^7$/Film thickness | Substrate | Ref. |
|---|---|---|---|---|---|---|---|
| Silver NPs | — | Inkjet Printing | NP | Argon-plasma/20 min | 0.35/NP | PEN | 16 |
| Silver salt solution in methanol/aminole (TEC-IJ-040) | — | Inkjet Printing | NP | 150/5 min | 1.2-2.1/ 0.875 μm | Glass | 21 |
| Silver acetate/ammonium hydroxide/formic acid/2,3 butandiol | — | Direct Ink writing | NP | 90/15 min | almost bulk/ NP | Glass | 22 |

TABLE 2-continued

A comparison of conductivities obtained using various silver inks

| *Silver Ink Type | Adhesion Test | Method of deposition | *Jetting Stability test | Sintering Temperature (° C.)/Time (in minute) | Conductivity (S/m) × 10⁷/Film thickness | Substrate | Ref. |
|---|---|---|---|---|---|---|---|
| [Ag(dien)](tmbd)/hexyfamine/ethyl cellulose | — | Spin-coating | NP | 250/130 min | 1-2.1/ 0.106 µm | PI | 24 |
| Silver oxalate/ethyl-amine/ethyl alcohol/ethylene glycol | Good | Inkjet Printing | NP | 1.50/30 min | 1.1/1.2 µm | PI | 25 |
| Silver-ethylamine-ethanolamine-formate-complex | Excellent, 5 B | Inkjet Printing | Excellent | 150/30 min | 2.12/ 3.89 µm | PEN | This work |
| Silver-ethylamine-ethanolamine-formate-complex | Excellent, 5 B | Inkjet Printing | Excellent | 150/30 min | 2.43/ 4.25 µm | Glass | This work |

NP = not provided

Adhesion Test of Printed Silver Film to Hard & Soft Substrates

The adhesion of the printed ink to several substrates, including glass, polyimide (P1), and PET films, can be assessed. Scotch® tape can be used to test adhesion by applying tape to the entire region of the each silver film. After removing the tape, the samples were inspected visually to determine the amount of silver that was removed from the substrate. It can be observed that the ink can possess suitable adherence to all of the substrates without any post-resistance change. All plastic films can also be stressed and bent with no observed decrease in adhesion of the silver film or any change in resistance.

Inkjet-Printing Smaller Features

Due to the particle free nature of this SOC ink and the excellent performance through a conventional inkjet nozzle (10 pL) presented in the previous sections, a smaller nozzle (1 pL) can be used without any clogging or flow issues. The spreading and drying of SOC ink may not be inhibited by particles and may need to be carefully controlled to obtain fine features. The minimum printed feature sizes and gaps can be investigated, which are of interest in electronics design. For printing narrow line traces, substrate surface energy should be uniform throughout the substrate area. To create uniform surfaces, glass substrate can be spin-coated (5000 rpm for 40 s) with a layer of PVP having a thickness of ~100 nm (5 wt % in 1-hexanol with 0.77 wt % of crosslinking agent poly (melamine-co-formaldehyde) and heated at 180° C. for 10 minutes prior to printing. FIGS. 7A-D show microscopic images and profiles of printed line tracks using a 1 pL nozzle sintered at 150° C. for 30 minutes and 20 µm drop-spacing, which can result in minimum line spacing of ~40 µm (image FIG. 7A & profile FIG. 7B) and ~18 µm (image FIG. 7C & profile FIG. 7D) with a line width of ~20 µm. These are suitable results for any inkjet-printed electronic applications which require small feature sizes.

Inkjet-Printed RF Inductors

There have been several reports of RF inductors[35-38], however due to the sensitivity to metal conductivity, thickness, and roughness, high quality inkjet-printed RF inductors remain elusive. RF inductors are a fundamental building block in circuits. Planar spiral inductors are common and Intel corp. has demonstrated inductors with quality factors (Q's) greater than 20, utilizing 8 µm of highly conductive metal.[39] Surface mount wire wound inductors are more complex to fabricate and they require mounting. However, they provide unrivaled performance, with inductance values greater than 10 nH and quality factors greater than 50.[40] Inductance values larger than one or two nH are physically large and are typically placed off chip; these could benefit the most from a printing technique. The pioneering work on inkjet-printed inductors demonstrates quality factors of ~0.5.[38] More recently, meander inductors and fully printed inductors have been shown with Q's approaching five.[36, 37] A 25 nH inductor with a Q approaching nine was also shown in 2014.[38] All of these printed inductors utilize nanoparticle ink as well as a sintering temperature greater than 150° C. In order to make repeatable, quality RF components by inkjet, a robust metal ink with high conductivity is required.

Figure 8A:
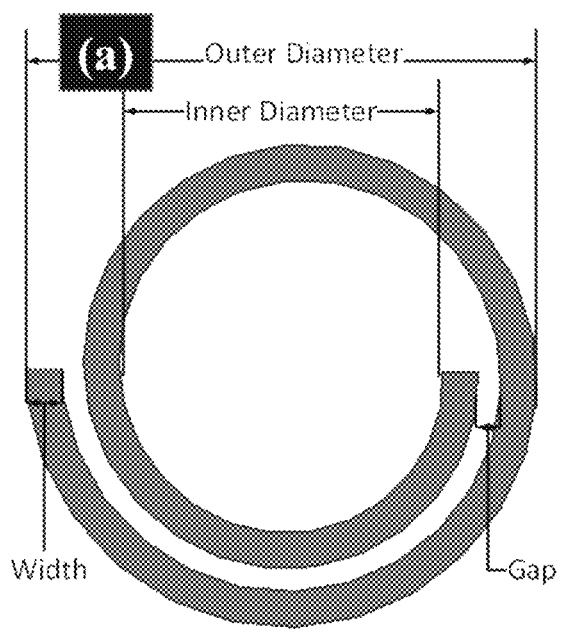
FIG. 8A is a conceptual depiction of an inductor with dimensions described herein.
Figure 8B:
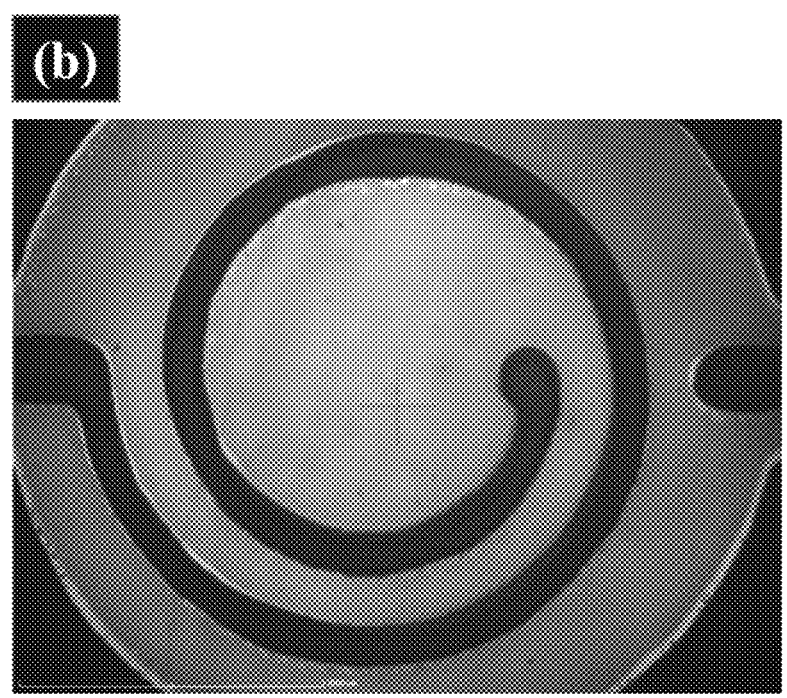
FIG. 8B depicts a microscope image of a printed inductor.
Figure 9A:
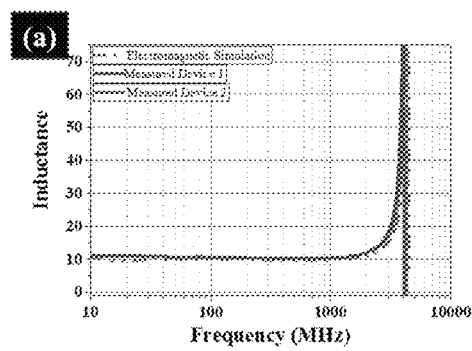
FIG. 9A depicts inductance versus frequency for printed inductors supported on a PEN substrate with a 1.5 turn inductance.
Figure 9B:
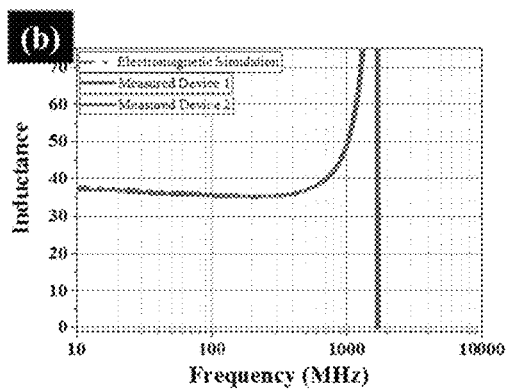
FIG. 9B depicts inductance versus frequency for printed inductors supported on a PEN substrate with a 2.5 turn inductance.
Figure 9C:
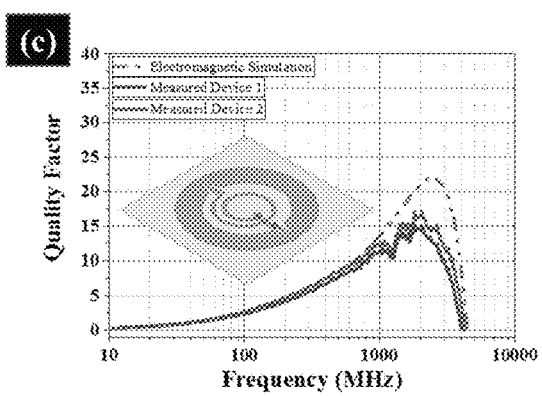
FIG. 9C depicts quality factor versus frequency for printed inductors supported on a PEN substrate with a 1.5 turn quality factor.
Figure 9D:
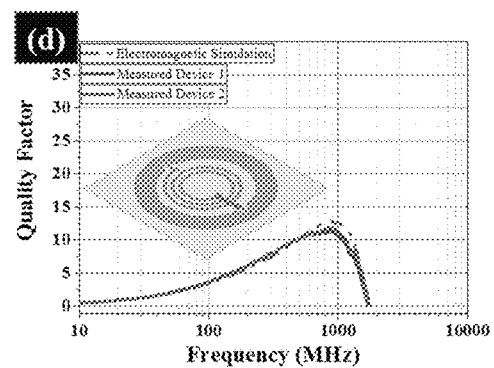
FIG. 9D depicts quality factor versus frequency for printed inductors supported on a PEN substrate with a 2.5 turn quality factor.

The SOC ink developed here presents improved performance over nanoparticle ink and can provide high value inductors with quality factors approaching 15. A depiction of the dimensions of the inductors as well as an image of the printed inductor is shown in FIGS. 8A and 8B respectively.

Spiral inductors can be designed with Ansoft High Frequency Structure Simulator software. Both a one and a half turn and a two and a half turn inductor can be fabricated. The devices can be measured with a network analyzer into the GHz regime, and the measured S-parameters from the analyzer can be converted to Y-parameters.[41] The return path and pads are de-embedded using a standard open short method to reduce parasitic effects.[41] After de-embedding, the inductance and quality factor are calculated using equations (1) and (2).

$$L = \frac{im\left(\frac{4}{Y_{11} + Y_{22} - Y_{12} - Y_{21}}\right)}{2\pi f}$$

$$Q = -\left(\frac{im(Y_{11} + Y_{22} - Y_{12} - Y_{121})}{re(Y_{11} + Y_{22} - Y_{12} - Y_{21})}\right)$$

The dimensions of the inductors along with the measured parameters of inductance, quality factors, and self-resonant frequencies are highlighted in Table I.

TABLE 3

MEASURED INDUCTORS

| | Dimensions | | | | Measured | | |
|---|---|---|---|---|---|---|---|
| Turn | Outer Diameter (mm) | Inner Diameter (mm) | Gap (μm) | Width (μm) | L (nH) | QF (max) | SRF (GHz) |
| 1.5 | 3.7 | 2.0 | 200 | 350 | 10.5 | 15 | 4 |
| 2.5 | 5.6 | 3.0 | 200 | 350 | 35.5 | 11 | 1.5 |

L = inductance, QF = quality factor, SRF = self-resonant frequency

The electromagnetic simulations show a match to the measured inductance values in FIGS. 9A-D, which demonstrate inductance and quality factor versus frequency for printed inductors of 1.5 (FIGS. 9A and 9C respectively) and 2.5 turn(s) (FIGS. 9B and 9D respectively) supported on PEN substrate. Two inductors were fabricated of each size validating the repeatability of the process. The measured inductors show quality factors above ten, which is can be considered state of the art for printed inductors. This can be a step forward in making high quality components with a robust printing process.

This example presents a detailed study of an embodiment of the present disclosure in the form of a novel type of SOC ink; namely, silver-ethylamine-ethanolamine-formate-complex based robust ink. SOC ink may have potential as a low cost alternative to nanoparticle based synthesis. It can provide high conductivities even at low temperatures ~150° C. It can be particle free and can be shown to have stable jetting for more than 5 months. With appropriate additives the stable complexation may not be disturbed and excellent adhesion to a wide variety of substrates can be achieved. To demonstrate the capability of the ink, RF inductors have been realized which can be sensitive to the conductivity, thickness, and roughness of the printed metal. Ten to 35 nH inkjet-printed spiral inductors on flexible plastic can exhibit maximum quality factors greater than ten and self-resonant frequencies above 1.5 GHz. These are initial SOC inkjet-printed inductors and can demonstrate improved performance over nanoparticle based devices even at a lower temperature. This robust ink formulation can shows potential for suitable high quality RF component fabrication as well as printed electronics in general.

Materials and Methods

Chemicals:

Silver acetate ($CH_3COOAg$, ReagentPlus®, 99%), ethylamine ($NH_2CH_2CH_3$, 2M in methanol, ACS reagent), ethanolamine ($NH_2CH_2CH_2OH$, ACS reagent, ≥99.0%), formic acid (HCOOH, reagent grade, ≥95.0%), and 2-hydroxyethylcellulose (2-HEC, MW=90,000) were used as they were received, without further purification.

Ink-formulation: In an illustrative experiment, a 2M ethylamine solution in methanol, which was called as "Complexing Solution #1" was put in a vial. 10 mL of ethanolamine and 10 mL of deionized (DI) water (1:1 ratio) was mixed in another a vial. Formic acid ($\eta$=1.78 mPa s, $\gamma$=37.67 mN/m, $T_b$=100.8° C.) can then be added to the solution in a drop-wise manner to adjust the solution to pH 10.5. The resulting solution was called "Complexing Solution #2". In another vial, 1 g of silver acetate was vortex mixed with 2 mL of complexing solution #1, 1.5 mL of complexing solution #2, and 0.5 mL of 2% 2-hydroxyethylcellulose (2% 2-HEC in water:methanol) at room-temperature for 30 seconds, resulting in a light black colored solution. This finding demonstrates that 2-HEC not only acts as viscofier, it also acts as an additive for adhesion of the ink to the substrate. The as-obtained solution can then kept for twelve hours to allow any particles to settle out, yielding a clear supernatant, which can be decanted and filtered through a 200 nm syringe filter. This clear and transparent solution that contains approximately ~17 wt % silver, served as the silver-ethylamine-ethanolamine-formate complex based SOC ink.

Inkjet-Printing of SOC Ink:

The as-formulated SOC ink can be inkjet-printed on various substrates using a variety of printers (such as a Dimatix printer) and/or printing processes, for example a drop-on-demand piezoelectric ink-jet nozzle (manufactured by Dimatix) with a diameter of 21 and 9 μm and drop volume of 10 and 1 pL per print nozzle. The uniform and continuous ejection of droplets can be achieved by adjusting various wave-forms while applying a firing voltage of 19-21 V at a 5 kHz printer velocity. In the present example, to quantify the number of drops for jetting stability test, five jets were chosen and their drop velocities of 5000 drops/s were adjusted, which can jetted continuously for 120 seconds. Subsequently, the total jetted drops were weighed and they correspond to the drop mass. Then, total drop mass was divided by number of drops, which provided the average drop mass in nano-grams. The ink droplets were dispensed with a spacing of 20 μm and several fine line patterns and electrodes (5 mm length and 0.25 mm width) were printed.

Fabrication and Measurement of Printed Inductors:

The inductors can be fabricated on PET substrate (t=125 μm) using five layers of AOC ink at 20 um drop spacing with a 10 pL Dimatix DMP 2831 inkjet printer. In the example, the ink was heated at 150° C. for 30 minutes in an oven after each layer was printed. A universal laser system PLS6.75 was utilized to cut via holes and make a connection with the underside of the inductors. Three layers of ink were printed to connect the vias and DuPont 5000 conductive paste and fill the laser drilled via holes. The inductors were measured in a two port configuration using 500 μm pitch Z-probes and a cascade probe station. An Agilent E8361A network analyzer was used to characterize the devices.

Characterization:

The structural properties can be examined using scanning electron microscopy (FEI NovaNano FEG-SEM 630). Measurements of the thickness and uniformity of printed features on substrates can be performed using a surface profiler (Veeco Dektak 150), 3D interferometry (Zygo, Newview 7300), and cross-sectional SEM images. The film thickness on flexible PEN substrate can be performed by milling through FIB tool (Quanta 3D FEG). Crystallinity of the silver film can be examined by X-ray diffraction (Bruker D8 Advance) in the range of 20-80° C. at 40 kV. The UV-Vis absorption spectrum of the ink can be obtained using a UV-Vis spectrophotometer (Cary 100 UV-Vis-NIR) with a standard 1 cm liquid cuvette, and with a background calibration run using deionized water. Surface tension and Rheology of the inks can be measured using a KRUSS Tensiometer and Rheometer (Bohlin Gemini 2). Thermogravimetric analysis was performed using a TG 209 F1 analyzer (Netzsch), which was equipped with TGA-IR (Tensor 27, Bruker), at a temperature range of 25-300° C.; it had a heating rate of 10° C./min in air flow. For isothermal thermogravimetric analysis, heating rate of 5° C./min was provided to reach the isothermal temperature. Differential scanning calorimetry (DSC) was observed by a STA 449 F1 (Netzsch) analyzer in nitrogen flow. Electrical resistances of silver electrodes were measured with a four-point probe method (Keithley 4200-SCS).

REFERENCES (1) Lee, T. I.; Choi, W. J.; Moon, K. J.; Choi, J. H.; Kar, J. P.; Das, S. N.; Kim, Y. S.; Baik, H. K.; Myoung, J. M. Programmable Direct-Printing Nanowire Electronic Components. *Nano Lett.* 2010, 10, 1016-1021.

(2) An, K.; Hong, S.; Han, S.; Lee, H.; Yeo, J.; Ko, S. H. Selective Sintering of Metal Nanoparticle Ink for Maskless Fabrication of an Electrode Micropattern Using a Spatially Modulated Laser Beam by a Digital Micromirror Device. *ACS Appl. Mater. Interfaces* 2014, 6, 2786-2790.

(3) Hamedi, M. M.; Hajian, A.; Fall, A. B.; Hakansson, K.; Salajkova, M.; Lundell, F.; Wagberg, L.; Berglund, L. A. Highly Conducting, Strong Nanocomposites Based on Nanocellulose-Assisted Aqueous Dispersions of Single-Wall Carbon Nanotubes. *ACS Nano* 2014, 8, 2467-2476.

(4) Lee, D.; Paeng, D.; Park, K.; Grigoropoulos, C. P. Vacuum-Free, Maskless Patterning of Ni Electrodes by Laser Reductive Sintering of NiO Nanoparticle Ink and Its Application to Transparent Conductors. *ACS Nano* 2014, 8, 9807-9814.

(5) Torrisi, F.; Hasan, T.; Wu, W.; Sun, Z.; Lombardo, A.; Kulmala, T. S.; Hsieh, G.-W.; Jung, S.; Bonaccorso, F.; Paul, P. J.; Chu, D.; Ferrari, A. C. Inkjet-Printed Graphene Electronics. *ACS Nano* 2012, 6, 2992-3006.

(6) Li, R.-Z.; Hu, A.; Zhang, T.; Oakes, K. D. Direct Writing on Paper of Foldable Capacitive Touch Pads with Silver Nanowire Inks. *ACS Appl. Mater. Interfaces* 2014, 6, 21721-21729.

(7) Ghosh, S.; Yang, R.; Kaumeyer, M.; Zorman, C. A.; Rowan, S. J.; Feng, P. X.-L.; Sankaran, R. M. Fabrication of Electrically Conductive Metal Patterns at the Surface of Polymer Films by Microplasma-Based Direct *Writing*. *ACS Appl. Mater. Interfaces* 2014, 6, 3099-3104.

(8) Magdassi, S.; Grouchko, M.; Berezin, O.; Kamyshny, A. Triggering the Sintering of Silver Nanoparticles at Room Temperature. *ACS Nano* 2010, 4, 1943-1948.

(9) Ladd, C.; So, J.-H.; Muth, J.; Dickey, M. D. 3D Printing of Free Standing Liquid Metal Microstructures. *Adv. Mater.* 2013, 25, 5081-5085.

(10) Diaz, E.; Ramon, E.; Carrabina, J. Inkjet Patterning of Multiline Intersections for Wirings in Printed Electronics. *Langmuir* 2013, 29, 12608-12614.

(11) Zheng, Y.; He, Z.-Z.; Yang, J.; Liu, J. Personal Electronics Printing via Tapping Mode Composite Liquid Metal Ink Delivery and Adhesion Mechanism. *Sci. Rep.* 2014, 4, 4588-4595.

(12) Kamyshny, A.; Magdassi, S. Conductive Nanomaterials for Printed Electronics. *Small* 2014, 10, 3515-3535.

(13) Ahn, B.; Duoss, E.; Motala, M.; Guo, X.; Park, S.; Xiong, Y.; Yoon, J.; Nuzzo, R.; Rogers, J.; Lewis, J. Omnidirectional Printing of Flexible, Stretchable, and Spanning Silver Microelectrodes. *Science* 2009, 323, 1590-1593.

(14) Valeton, J. J. P.; Hermans, K.; Bastiaansen, C. W. M.; Broer, D. J.; Perelaer, J.; Schubert, U. S.; Crawford, G. P.; Smith, P. J. Room Temperature Preparation of Conductive Silver Features using Spin-coating and Inkjet Printing. *J. Mater. Chem.* 2010, 20, 543-546.

(15) Perelaer, J.; Jani, R.; Grouchko, M.; Kamyshny, A.; Magdassi, S.; Schubert, U. S. Plasma and Microwave Flash Sintering of a Tailored Silver Nanoparticle Ink, Yielding 60% Bulk Conductivity on Cost-Effective Polymer Foils. *Adv. Mater.* 2012, 24, 3993-3998.

(16) Perelaer, J.; Abbel, R.; Wünscher, S.; Jani, R.; Lammeren, T.; Schubert, U. S. Roll-to-Roll Compatible Sintering of Inkjet Printed Features by Photonic and Microwave Exposure: From Non-Conductive Ink to 40% Bulk Silver Conductivity in Less Than 15 Seconds. *Adv. Mater.* 2012, 24, 2620-2625.

(17) Liu, Y.-K.; Lee, M.-T. Laser Direct Synthesis and Patterning of Silver Nano/Microstructures on a Polymer Substrate. *ACS Appl. Mater. Interfaces* 2014, 6, 14576-14582.

(18) Lee, H. M.; Seo, J. Y.; Jung, A.; Choi, S.-Y.; Ko, S. H.; Jo, J.; Park, S. B.; Park, D. Long-Term Sustainable Aluminum Precursor Solution for Highly Conductive Thin Films on Rigid and Flexible Substrates. *ACS Appl. Mater. Interfaces* 2014, 6, 15480-15487.

(19) Shin, D.-H.; Woo, S.; Yem, H.; Cha, M.; Cho, S.; Kang, M.; Jeong, S.; Kim, Y.; Kang, K.; Piao, Y. A Self-Reducible and Alcohol-Soluble Copper-Based Metal-Organic Decomposition Ink for Printed Electronics. *ACS Appl. Mater. Interfaces* 2014, 6, 3312-3319.

(20) Kamyshny, A.; Steinke, J.; Magdassi, S. Metal-based Inkjet Inks for Printed Electronics. *TOAPJ* 2011, 4, 19-36.

(21) Perelaer, J.; Hendriks, C. E.; WM de Laat, A.; Schubert, U. S. One-step Inkjet Printing of Conductive Silver Tracks on Polymer Substrates. *Nanotechnology* 2009, 20, 165303-165307.

(22) Walker, S. B.; Lewis, J. A. Reactive Silver Inks for Patterning High-Conductivity Features at Mild Temperatures. *J. Am. Chem. Soc.* 2012, 134, 1419-1421.

(23) Liu, Y.-K.; Lee, M.-T. Laser Direct Synthesis and Patterning of Silver Nano/Microstructures on a Polymer Substrate. *ACS Appl. Mater. Interfaces* 2014, 6, 14576-14582.

(24) Chen, C.-N.; Dong, T.-Y.; Chang, T.-C.; Chen, M.-C.; Tsai, H.-L.; Hwang, W.-S. Solution based β-diketonate Silver Ink for Direct Printing of Highly Conductive Features on a Flexible Substrate. *J. Mater. Chem.* C 2013, 1, 5161-5168.

(25) Dong, Y.; Li, X.; Liu, S.; Zhu, Q.; Li, J.-G.; Sun, X. Facile Synthesis of High Silver Content MOD Ink by using Silver Oxalate Precursor for Inkjet Printing Applications. *Thin Solid Films* 2015, 589, 381-387.

(26) Gardner, D. J.; Oporto, G. S.; Mills, Ryan; Samir, M. A. S. A. Adhesion and Surface Issues in Cellulose and Nanocellulose. *J. Adhes. Sci. Technol.* 2008, 22, 545-567.

(27) Joo, S.; Baldwin, D. F. Adhesion Mechanisms of Nanoparticle Silver to Substrate Materials: Identification. *Nanotechnology* 2010, 21, 055204-055215.

(28) Cao, Z.; Stevens, M. J.; Dobrynin, A. V. Adhesion and Wetting of Nanoparticles on Soft Surfaces. *Macromolecules* 2014, 47, 3203-3209.

(29) Falk, M.; Whalley, E. Infrared Spectra of Methanol and Deuterated Methanols in Gas, Liquid, and Solid Phases. *J. Chem. Phys.* 1961, 34, 1554-1568.

(30) Zelayandia, O. Adsorbent for gases, WO2007022595 A1, Mar. 1, 2007.

(31) P. Larkin, *Infrared and Raman Spectroscopy Principles and Spectral Interpretation*, 1st ed; Elsevier Publications, Waltham, Mass., USA 2011.

(32) Vaseem, M.; Lee, K. M.; Hong, A-R.; Hahn, Y.-B. Inkjet Printed Fractal-Connected Electrodes with Silver Nanoparticle Ink. *ACS Appl. Mater. Interfaces* 2012, 4, 3300-3307.

(33) Hummelgård, M.; Zhang, R.; Nilsson, H.-E.; Olin, H. Electrical Sintering of Silver Nanoparticle Ink Studied by in-situ TEM Probing. *PLoS ONE* 2011, 6, el 7209.
(34) Iijima, S.; Ajayan, P. M. Substrate and Size Effects on the Coalescence of Small Particles. *J. Appl. Phys.* 1991, 70, 5138-5140.
(35) Redinger, D.; Molesa, S.; Yin, S.; Farschi, R.; Subramanian, V. An Ink-Jet-Deposited Passive Component Process for RFID. *IEEE Trans. Electron Devices*, 2004, 51, 1978-1983.
(36) Menicanin, A. B.; Zivanov, L. D.; Damnjanovic, M. S.; Maric, A. M. Low-Cost CPW Meander Inductors Utilizing Ink-Jet Printing on Flexible Substrate for High-Frequency Applications. *IEEE Trans. Electron Devices*, 2013, 60, 827-832.
(37) McKerricher, G.; Perez, J. G.; Shamim, A. Fully Inkjet Printed RF Inductors and Capacitors Using Polymer Dielectric and Silver Conductive Ink With Through Vias. *IEEE Trans. Electron Devices*, 2015, 62, 1002-1009.
(38) Cook, B. S.; Mariotti, C.; Cooper, J. R.; Revier, D.; Tehrani, B. K.; Aluigi, L.; Roselli, L.; Tantzeris, M. M. Inkjet-printed, Vertically-integrated, High-performance Inductors and Transformers on Flexible LCP Substrate, *International Microwave Symposium (IMS) IEEE International* 2014, 1-4
(39) Jan, C.-H.; Agostinelli, M.; Buehler, M.; Chen, Z.-P.; Choi, S.-J.; Curello, G.; Deshpande, H.; Gannavaram, S.; Hafez, W.; Jalan, U.; Kang, M.; Kolar, P.; Komeyli, K.; Landau, B.; Lake, A.; Lazo, N.; Lee, S.-H.; Leo, T.; Lin, J.; Lindert, N.; Ma, S.; McGill, L.; Meining, C.; Paliwal, A.; Park, J.; Phoa, K.; Post, I.; Pradhan, N.; Prince, M.; Rahman, A.; Rizk, J.; Rockford, L.; Sacks, G.; Schmitz, A.; Tashiro, H.; Tsai, C.; Vandervoorn, P.; Xu, J.; Yang, L.; Yeh, J.-Y.; Yip, J.; Zhang, K.; Zhang, Y.; Bai, P. A 32 nm SoC Platform Technology with 2nd Generation High-k/ Metal Gate Transistors Optimized for Ultra Low Power, High Performance, and High Density Product Applications, *Electron Devices Meeting (IEDM), IEEE International* 2009, 1-4.
(40) High Q-multilayer Chip Inductor for High Frequency Applications," Taiyo Yuden Corp., Product Data Sheet, October 2011.
(41) Frickey, D. A. Conversions Between S, Z, Y, H, ABCD, and T Parameters which are Valid for Complex Source and Load Impedances. *IEEE Trans. Microwave Theory Technology* 1994, 42, 205-211.

Example 2

Fully inkjet-printed 3D objects with integrated metal provide exciting possibilities for on-demand fabrication of radio frequency electronics such as inductors, capacitors and filters. To date, there have been several reports of printed radio frequency components metallized via the use of plating solutions, sputtering, and low-conductivity pastes. These metallization techniques require rather complex fabrication and do not provide an easily integrated or versatile process.

This example utilizes a novel silver ink cured with a low-cost infrared lamp at only 80° C. and achieves a high conductivity of $1\times10^7$ S/m. By inkjet printing the infrared-cured silver together with a commercial 3D inkjet ultraviolet-cured acrylic dielectric, a multilayer process is demonstrated. By using a smoothing technique, both the conductive ink and dielectric provide surface roughness values of less than 500 nm. A radio frequency inductor and capacitor exhibit state-of-the-art quality factors of 8 and 20, respectively, and match well with electromagnetic simulations. These components are implemented in a lumped element radio frequency filter with an impressive insertion loss of 0.8 dB at 1 GHz, proving the utility of the process for sensitive radio frequency applications.

One of the major advancements in inkjet printing has been the use of UV-cured acrylic materials. These liquid inks immediately solidify upon exposure to a low-cost UV lamp, and, like acrylic paints, they can be made with vibrant colors. This concept has been extended beyond graphic arts by using hundreds of inkjet nozzles to form fully printed 3D acrylic parts in minutes. Although multi-jet technology is still in its infancy, commercial multi-jet printers are now available. 1 A major advantage of the 3D multi-jet process over other 3D printing methods, such as stereolithography, selective laser sintering, or fused deposition modeling, is that multiple materials can be easily deposited together, just as an inkjet head routinely prints with cyan, magenta, yellow and black. Thus far, multi-jet printing has been restricted to the colorful UV-cured acrylics and wax/gel support materials. Fully printing objects with an integrated high-conductivity metal provides exciting possibilities for additive and on-demand fabrication of radio frequency electronics such as inductors, capacitors and filters.

To date, there have been several reports of printed objects incorporating metal, focused on RF applications, by using plating solutions, aerosol, sputtering, and low-conductivity pastes.[2,3,4] These metallization techniques require rather complex fabrication and do not provide an easily integrated or versatile process. Previous reports have also put the spotlight on other issues with 3D printing techniques for electronics fabrication, such as micrometer surface roughness and low conductivity of the metal.[5] A recent report by Wu et al. shows a novel concept of 3D printing, together with syringe injection of a silver paste at 70° C., to create 3D inductors and capacitors; however, the conductive paste achieves a low conductivity of $2.8\times10^5$ S/m, approximately 200 times less than that of bulk silver.[2] In our previous work, silver nanoparticles were utilized to metallize a 3D printed antenna, but the particles required selective laser sintering of the particles to avoid damaging the acrylic material and achieved a conductivity of only $1\times10^6$ S/m.[6] A major challenge of fully printing electronics is that the high temperature required for the metal is incompatible with the printed dielectric.

Most of the previous work on inkjet-printed Radio Frequency (RF) passives is focused on 2D inkjet printing of metal on a standard substrate. Redinger et al. reported some of the first work on 2D printed capacitors and inductors in 2004, utilizing nanoparticles but achieving rather low quality factors (Q's) of ~0.5.[7] Since then, there have been material and printing advancements enabling 2D printed inductors and capacitors with high-frequency Q's below[10,8,9,10] To our knowledge, the combination of these fully printed components to design a GHz lumped element filter has never been demonstrated. Distributed 2D RF filters are generally simpler to print than lumped element filters. Previous distributed filter results have shown inadequate performance, with the insertion loss ranging from 3.6 to 10 dB.[11,12,13,14,15] One of the best reports has shown an insertion loss of approximately 0.5 dB at its center frequency (2 GHz), but it utilized inkjet printing along with electroless plating to increase the conductivity and thickness of the metal.[16]

This example provides a process beyond 2D inkjet printing of the conductor on a standard support substrate; the metal is truly integrated into the printed dielectric to build quality multilayer RF capacitors and inductors with cross-over interconnects. An advancement is the low processing temperature (80° C.) of the novel Silver-Organo-Complex (SOC) ink, which overcomes the challenge of temperature processing compatibility between the printed conductor and dielectric. The SOC ink is cured with a low-cost IR lamp in only 5 minutes while providing state-of-the-art conductivity of 1×107 S/m, which is necessary for conductivity-sensitive RF filter applications.

Materials and Methods

Ultraviolet-Cured Dielectric Ink

Stratasys UV-cured ink is sold under the name Vero™ and comes in different colors and hardnesses. From the material safety data sheet of VeroWhite™, it is composed mostly of acrylic monomers (<30%), isobornyl acrylate (<25%), and various other components, including acrylate oligomers and urethane acrylates.[17,18] Less than 1% titanium dioxide is used for the white color. The photoinitiator is Diphenyl-2,4,6 trimethylbenzoyl oxide (<2%), which produces a free radical upon UV exposure, initiating the polymer reaction of the acrylic monomers and oligomers to form a hardened acrylic part. The acrylic monomers are liquid at room temperature but too viscous for jetting at 125 cp; see FIG. 10A.

Although the UV dielectric ink is tailored for the Stratasys Objet product line of 3D inkjet printers, it was more convenient to print with a Dimatix 2831 printer. It is worth noting that by adjusting the viscosity and surface tension of the solution complex ink-chemistry, this type of ink can be used for various deposition techniques (e.g., spin-coating, direct ink writing, fine nozzle printing, airbrush spraying, screen printing, and roll-to-roll processing methods). The Dimatix printer allows control over nearly all print settings. By using a jetting temperature of 60° C., the viscosity of the dielectric ink drops to 20 cp, as shown in FIG. 10A, allowing for excellent jetting from the Dimatix 10-pL print head. The ink does not show any change in viscosity over the three different shear rate measurements shown in FIG. 10A. The average drop in mass of the UV-cured ink jetted at 60° C. and a 9-m/s velocity is 9.6 ng, measured by ejecting five million drops and weighing the total. Throughout this work, the UV-cured ink is printed with two layers at 30 μm, with drop spacing forming 11-μm-thick layers. For curing, it is exposed to 7500 mJ/cm$^2$ of 365-nm-wavelength light after printing.

After UV curing, thermogravimetric analysis was completed to understand the thermal limits of the material; see FIG. 10B. The TGA shows that there is negligible mass loss up to 150° C.; however, the material specification sheet reports the glass transition for the material approximately 47-53° C., and it was found experimentally that there is extreme warping of the material over 80° C.[19] Therefore, it may be necessary to have a conductor that can be processed at temperatures under 80° C.

To design radio frequency components, it is important to know the dielectric properties. From the parallel plate measurements (FIG. 10C, 10D), the VeroWhite™ material has a dielectric constant of ~3.0 and a dissipation factor of ~0.02 up to 1 GHz. The dissipation factor of the material is rather high and can cause attenuation of the RF signal; however, FR-4 also has a dissipation factor of 0.02 and is the go-to material for low-cost RF applications.[20] Overall, this material is adequate for many RF designs but does have appreciable dielectric loss, and it has limitations in terms of temperature range (<45° C.) that should be respected.

Infrared-Cured Silver-Organo-Complex Ink

The SOC ink utilized herein has been developed in-house to overcome the issues with conventional metal nanoparticle ink. While silver nanoparticle ink has been widely investigated and is available commercially, it has a complex synthesis protocol, high cost, and high sintering temperature (>150° C.), and exhibits particle aggregation, nozzle clogging, a poor shelf life, and jetting instability. Through the use of smaller nanoparticles (~10 nm) and a more robust ink formulation, commercial silver ink performance has improved in recent years. However, in the long term, it is difficult to avoid particle aggregation and precipitation in a nanoparticle system.

Organometallic inks are another approach to printing conductive patterns. They contain dissolved precursors of metallic elements bonded with organics (i.e., silver acetate, silver oxalate and copper hexanoate).[21, 22, 23] In general, the organometallic bond is broken, and the organic molecule evaporates away, leaving a metal film behind. In the past, organometallics have been less successful than their nanoparticle counterparts. One issue has been bubble formation, resulting in rough porous thin films as noted by Walker et al.[24]

An in-house SOC ink is utilized in this work, and it is capable of producing smooth and dense films; it is stable and transparent, as descried herein.[25] The SOC ink produces films with an impressive 1×107 S/m, 20% of the bulk conductivity at only 80° C. Along with the high conductivity at low temperatures, the ink exhibits strong adhesion, long-term stability (>5 months in a print head), and robust jetting performance. Briefly, the ink is based on a silver salt, an organo-complex of a first complexing agent that can be an alkylamine and a second complexing agent that can be an aminoalcohol, and a short chain carboxylic acid. In this particular example, the ink is based on a silver acetate complex with ethylamine, ethanolamine, water, methanol and 2-hydroxyethyl cellulose (HEC) (Mw 90,000), where the HEC is an additive that acts as both viscosity modifier and adhesion promoter. The water and methanol serve as solvents.

The fluid parameters and operating points of both the SOC ink and the VeroWhite™ dielectric ink are given in Table 4. The Reynolds, Weber, Ohnesorge, and capillary number are provided since inks are often mapped by these parameters to fit in a specific jetting space. To determine the fluid properties the SOC ink is measured at 25° C. with a jetting velocity of 10 m/s. VeroWhite™ dielectric ink is measured at 60° C. with a jetting velocity at 9 m/s velocity. Both inks utilize a Dimatix 10-pL DMC cartridge with a 21-μm-diameter nozzle. Although the SOC ink has a lower viscosity than the dielectric ink at 5.9 compared to 20 cp, both inks have good jetting stability and fit within the jetting space outlined by Derby et al.[26]

TABLE 4

| Ink Type | Viscosity (cp) | Surface T. Dyne/cm | Density (g/cc) | Drop Mass (ng) | (Oh) | (Re) | (We) | (Ca) |
|---|---|---|---|---|---|---|---|---|
| SOC Ink | 5.9 | 30.7 | 1.17 | 7.0 | 0.21 | 41.6 | 80.0 | 1.9 |
| VeroWhite ™ Dielectric Ink | 20.0 | 30.2 | 1.1 | 9.6 | 0.75 | 10.4 | 62 | 6.0 |

Surface T. = Surface Tension, Oh = Ohnesorge, Re = Reynolds, We = Weber, Ca = Capillary.

Figure 11B:
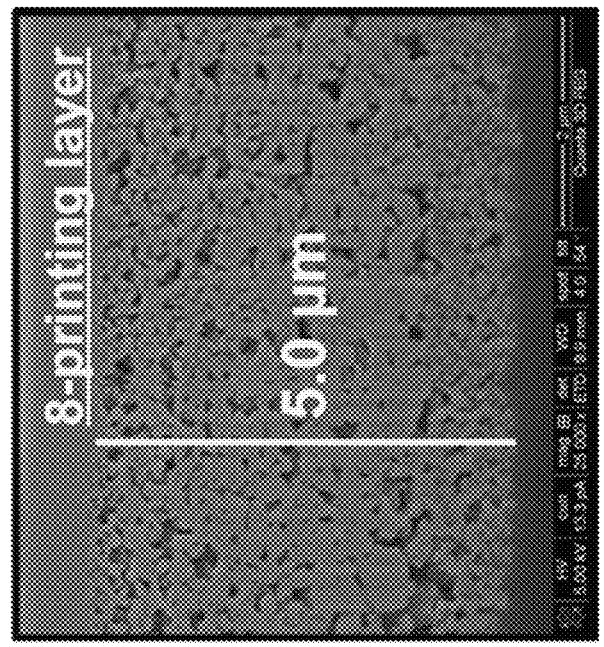
FIGS. 11A and 11B depict (A) conductivity as a function of overprinting layers at different sintering conditions, i.e., thermal heating at 150° C./30 min and IR heating at <80° C./5 min., and (B) SEM-focused ion beam cross-section of 8-layers of SOC ink with 5 minutes of IR<80° C. treatment after each overprint, respectively.
Figure 11A:
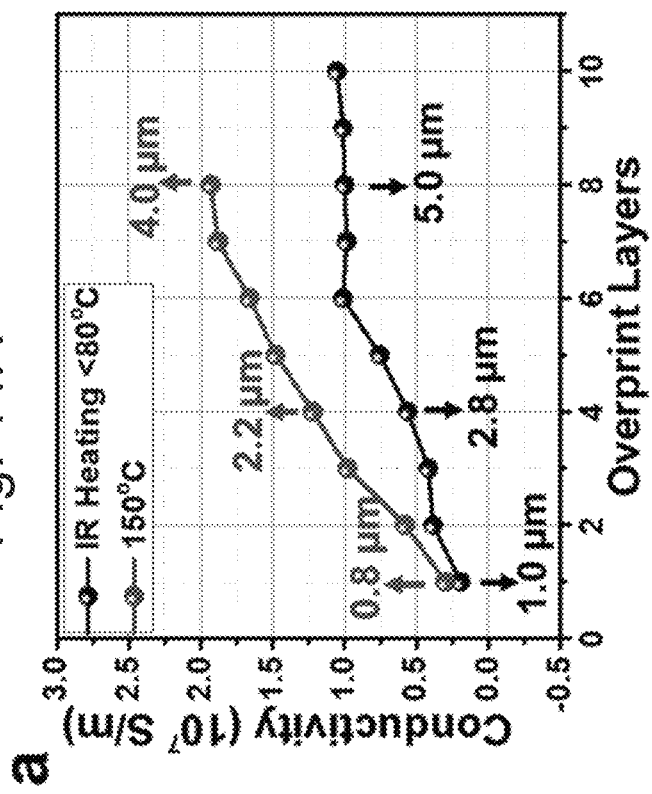

The conductivity of the SOC ink has been tested as a function of layer thickness, as shown in FIG. 11A. The conductivity of the ink approaches 2×107 S/m at 150° C. and 1×107 S/m at 80° C. with increased overprints. Note that the 150° C. heating was achieved on a glass substrate since the acrylic material would deform at temperatures above 80° C. A low-cost 250-watt IR lamp is used to cure the ink by putting the substrate under the light for five minutes after each printed layer. The maximum measured temperature of the substrate is 80° C. This method was capable of achieving a high conductivity of 1×107 S/m by approximately 6 overprints.

From the cross-section of Scanning Electron Microscopy (SEM) images (FIGS. 12A-12H), there are clear voids in the printed film that are subsequently filled in by the overprints. More overprints result in a dense film with higher conductivity.

Via 8 overprints and IR curing cycles, the film is fairly dense and approximately 5-μm-thick, as seen in FIG. 11B.

Adhesion was a concern for the ink, and it was found experimentally that the addition of 0.02 wt. % 2-HEC solved the issue while increasing viscosity for superior jetting. Adhesion to glass, PET, and the 3D printed materials was tested with scotch tape without any removal of the silver film. The ink is stable over the long term, as tested with a Dimatix 10-pL cartridge over five months with no observable reduction in the overall drop mass. Additionally, the printed films showed no significant difference in conductivity after 10 months aging in environmental conditions.

Fabrication Process

Figure 13:
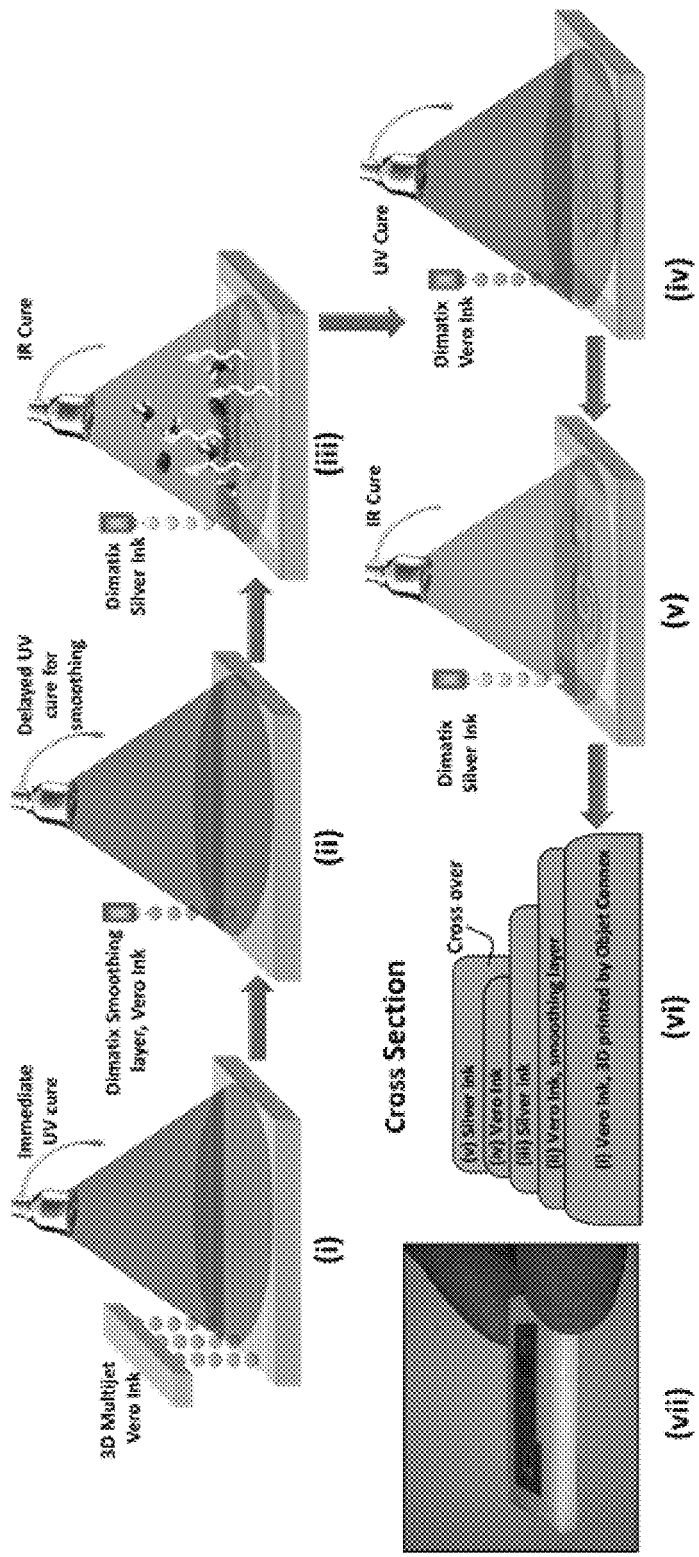
FIG. 13 is a schematic presentation of the fabrication process for a multilayer inkjet-printed radio frequency electronics of the present disclosure.

A depiction of the complete inkjet process is shown in FIG. 13, Steps (i)-(vii). Two different printers were utilized, the Objet 3D multijet printer and Dimatix 2831 research printer, for convenience. The multijet printer allows quick processing of the UV material, while the Dimatix printer allows for more control over all of the print parameters and curing. It is easy to envision a single inkjet system or production line capable of performing all printing and curing.

First, the UV cure material is printed with the Objet 3D printer, allowing for complex and thick shapes to be printed (Step (i), FIG. 13). After 3D printing, the substrate has several micrometers of surface roughness, as shown in FIG. 15A. This roughness is substantial considering that the printed metal thickness itself is less than a micrometer per layer. Surface roughness is especially detrimental in RF components since it causes attenuation of the signal. The roughness issue is tackled by jetting an additional "smoothing" layer of dielectric ink (FIG. 15B) with the Dimatix 2831 inkjet printer and 10-pL head (Step (ii), FIG. 13). After deposition, the ink is allowed to spread before UV curing, and eventually, it smoothens the surface to 0.4 μm of RMS roughness. The SOC ink can then be printed on this smooth layer and cured with IR heating (Step (iii), FIG. 13). Next, in step (iv), the dielectric ink is printed with the Dimatix, and the dielectric ink covers the silver ink and is again cured with a UV lamp. Finally, in Step (v), another layer of SOC ink can be printed, creating a multilayer process where the top and bottom layers are connected with crossovers. A cross-section depiction of the process is shown in FIG. 13, Step (vi). Note that the silver and dielectric printing (iv-v) could be repeated to create several layers for more complex electronics designs. An image of a fully printed part is shown in FIG. 13, Step (vii).

One difficulty to overcome during the fabrication was the wetting of the dielectric VeroWhite™ ink on the silver layer. The dielectric ink spreads excessively on the solid silver layer underneath. To optimize the wetting condition, a perfluorodecanethiol (PFDT) treatment was used. This treatment has been demonstrated by Tseng et al. to increase the surface hydrophobicity of printed electrodes.[27] The parts are dipped in a bath of 0.28 mL PFDT with 100 mL of IPA, then rinsed in IPA and dried with nitrogen. The change can be seen in the contact angle measurement of the dielectric, as is shown in FIG. 14. Without treatment, the ink spreads uncontrollably on the surface (note that all images are taken 5 seconds upon impact). After 10 minutes of surface treatment, the contact angle was stable at 65° C., and high definition patterns were possible with the dielectric ink on top of the silver. This allows for the dielectric and silver to be printed in a multilayer fashion capable of fabricating RF passives.

Experimental

Silver-Organo-Complex Ink Formulation

In an illustrative experiment, a 2 M ethylamine ($NH_2CH_2CH_3$, ACS reagent) solution in methanol, which was called "Complexing Solution #1," was put in a vial. 10 mL of ethanolamine ($NH_2CH_2CH_2OH$, ACS reagent, ≥99.0%) and 10 mL of deionized (DI) water (1:1 ratio) were mixed in another vial. Formic acid (HCOOH, reagent grade, ≥95.0%) was then added to the solution in a drop-wise manner to adjust the solution to a pH of 10.5. The resulting solution was called "Complexing Solution #2." In another vial, 1 g of silver acetate ($CH_3COOAg$, ReagentPlus®, 99%) was vortex mixed with 2 mL of complexing solution #1, 1.5 mL of complexing solution #2, and 0.5 mL of 2% 2-hydroxyethylcellulose (2% 2-HEC in water:methanol MW=90,000) at room-temperature for 30 seconds, resulting in a light black-colored solution. 2-HEC not only acts as a viscosifier, it also acts as an additive for adhesion of the ink to the substrate. The as-obtained solution was then kept for twelve hours to allow any particles to settle out, yielding a clear supernatant, which was decanted and filtered through a 200-nm syringe filter. This clear and transparent solution, containing approximately ~17 wt % silver, served as the silver-ethylamine-ethanolamine-formate complex-based SOC ink.[25]

Characterization of the Capacitor, Inductor and Filter

Capacitors were measured with an Agilent 4980A LCR meter. The leakage current was measured with a Keithley 4200-SCS. High-frequency measurements of the passive devices were taken in a two-port configuration using 500-μm-pitch Z-probes and a cascade probe station with an Agilent E8361A network analyzer. The structural properties were examined using scanning electron microscopy (FEI NovaNano FEG-SEM 630). The thickness and uniformity of printed features on substrates were measured using a surface profiler (Veeco Dektak 150) and 3D interferometry (Zygo, Newview 7300). The surface tension and viscosity of the inks were measured using a KRUSS DSA100 and Brookfield Rheometer (DV3T). Thermogravimetric analysis was performed using a TG 209 F1 analyzer (Netzsch), with a heating rate of 10° C./min in air flow.

Results

Low-Frequency Capacitor Characterization

Figure 16A:
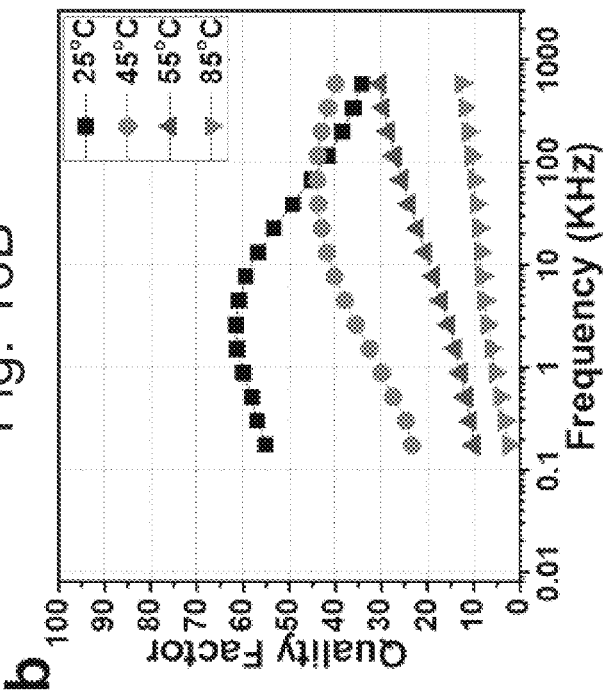
FIGS. 16A and 16B show (A) capacitance at low frequency as a function of temperature, and (B) quality factor, tested at 1 V AC signal and 0 V bias condition. 11-μm-thick printed layers.
Figure 16B:
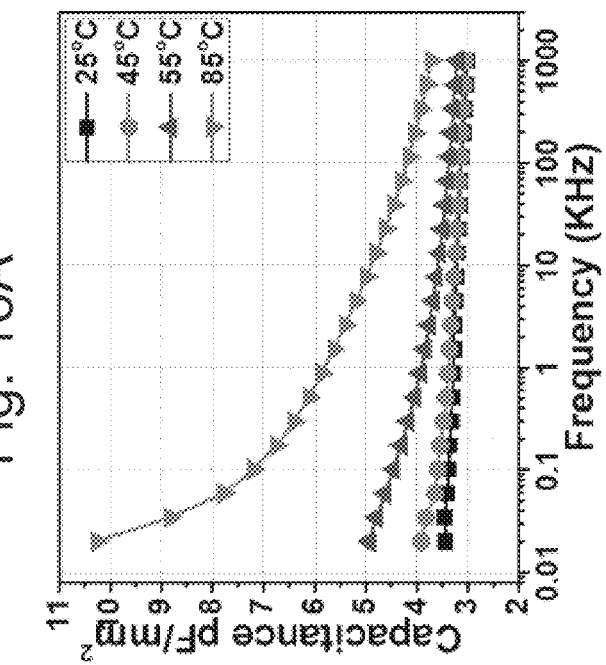

To evaluate the process, Metal Insulator Metal (MIM) capacitors were first printed with the SOC ink for electrodes and the dielectric ink using the process previously described. Capacitors allow for characterization of the leakage current, dielectric, behavior and quality factor at low frequency. The printed capacitors have excellent leakage current values of approximately 1×10-10 A/cm2 at 0.08 MV/cm, equivalent to 100 V across the 11-μm-thick capacitor. The capacitors were also tested against frequency and temperature; see FIG. 16A, 16B. While the dielectric constant in FIG. 16A is relatively flat with a frequency (~3) up to 45° C., the material shows considerable low-frequency dispersion at elevated measurement temperatures. This temperature issue can also be seen in the decrease in the quality factor shown in FIG. 16B. After cooling to room temperature, the dielectric properties return to the 25° C. case.

This is a known behavior in acrylic materials, caused from dielectric relaxation at the glass transition temperature, (~50° C.). A thorough investigation of the dielectric relaxation in thin acrylic sheets has been studied by Wubbenhost et al., who described this phenomenon.[28] A complete characterization of the dielectric relaxation with temperature for this material is out of the scope of the present disclosure. The important point is that the dielectric properties are sensitive to temperature and should be operated below the glass transition. Humidity impacts the capacitors, providing a ~10% normalized capacitance increase accompanied by a quality factor reduction when tested from 25% relative humidity to 85% relative humidity. The dielectric has also been tested against voltage bias and shows ideal behavior with negligible change in capacitance value or quality factor. The major changes in both physical and electrical dielectric properties occur at elevated temperature. However, there is no issue as long as the material is fabricated below 80° C. to avoid excessive warping and operated below 45° C. to avoid dielectric changes at the glass transition temperature.

High Frequency Characterization of the Capacitor, Inductor and Filter

The capacitor, inductor and filter were all measured at high frequencies with a vector network analyzer in a two-port configuration. Electromagnetic models of the devices were created using Ansoft High Frequency Structure Simulator (HFSS) software with the appropriate conductivity, thickness and dielectric properties to compare with measurements. From the network analyzer, the measured S-parameters are de-embedded with an open-short method and are converted to Y-parameters at each frequency point f, which is a standard procedure.[29,30] The following equations are used to convert to capacitance C, inductance L, and quality factor Q.

$$C = \frac{1}{\text{im}\left(\frac{4}{Y_{11} + Y_{22} - Y_{12} - Y_{21}}\right) 2\pi f} \quad (1)$$

$$L = \frac{\text{im}\left(\frac{4}{Y_{11} + Y_{22} - Y_{12} - Y_{21}}\right)}{2\pi f} \quad (2)$$

$$Q = -\left(\frac{\text{im}(Y_{11} + Y_{22} - Y_{12} - Y_{21})}{\text{re}(Y_{11} + Y_{22} - Y_{12} - Y_{21})}\right) \quad (3)$$

$$(4)$$

Figure 7A:
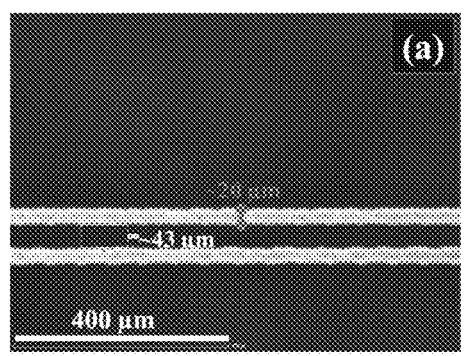
FIG. 7A depicts a microscope image of printed narrower lines with an ~40 μm gap.
Figure 7B:
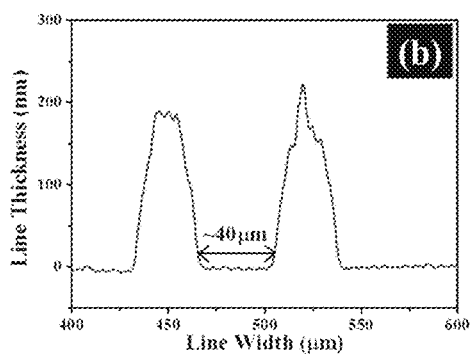
FIG. 7B depicts a profile of the 40 μm gap in FIG. 7A.
Figure 7C:
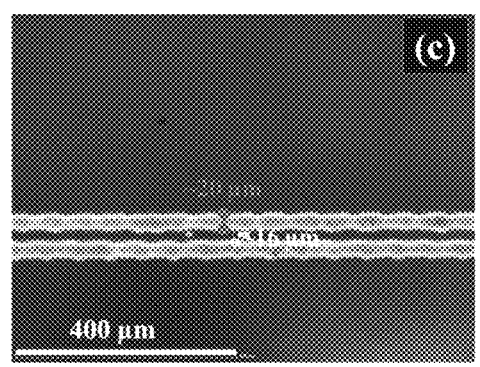
FIG. 7C depicts a microscope image of printed narrower lines with an 18 μm gap.
Figure 7D:
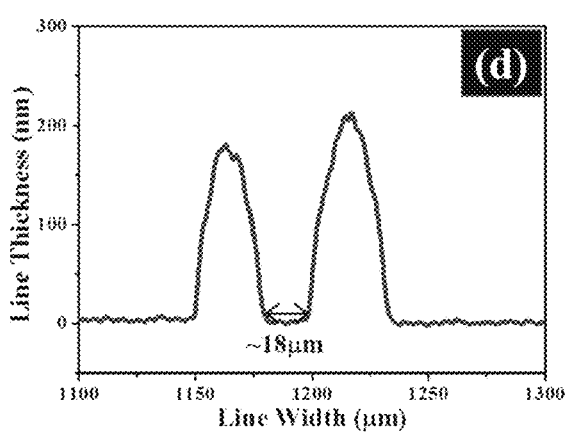
FIG. 7D depicts a profile of the 18 μm gap in FIG. 7C.
Figure 17A:
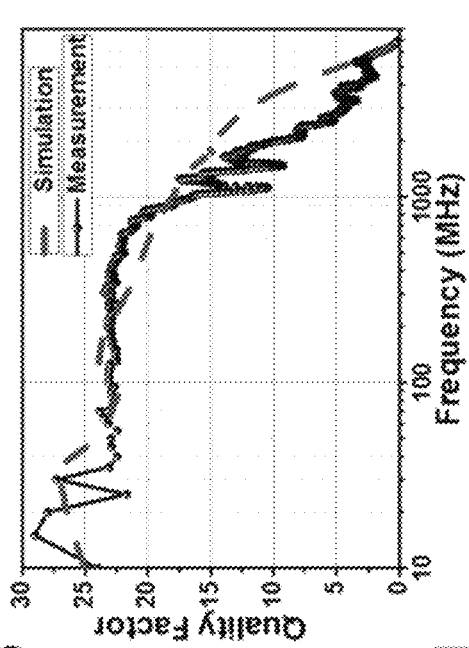
FIGS. 17A-17D show (A) a capacitor measured and simulated, (B) the quality factor of the capacitor (capacitor area is ~0.9 mm$^2$ with an 11-μm dielectric), (C) an Inductor measured and simulated and (D) the quality factor of the inductor (1.5 turn inductor with an outer radius of 4 mm and 600-μm-thick lines), respectively.
Figure 17B:
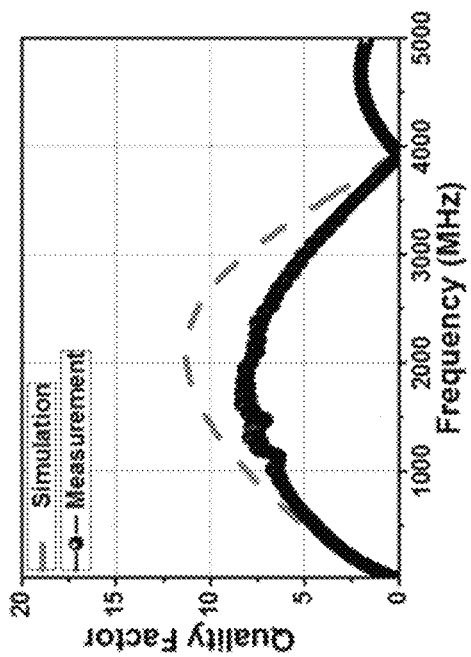

FIGS. 17A, 7B show the quality factor and the capacitance value as a function of frequency, respectively. The capacitor is 2 pF and has a self-resonant frequency of 6.5 GHz. The quality factor of the capacitor starts out at 25 and drops down to zero at self-resonance as expected. The quality factor results are also consistent with the measured devices at lower frequency and 25° C., as shown in FIG. 14A. It should be noted that previous printed dielectrics have had difficulty achieving such high quality factors in the high MHz and GHz regime, typically reporting Q's lower than 10, largely due to the loss tangent of the dielectrics used.[8,9]

Figure 17C:
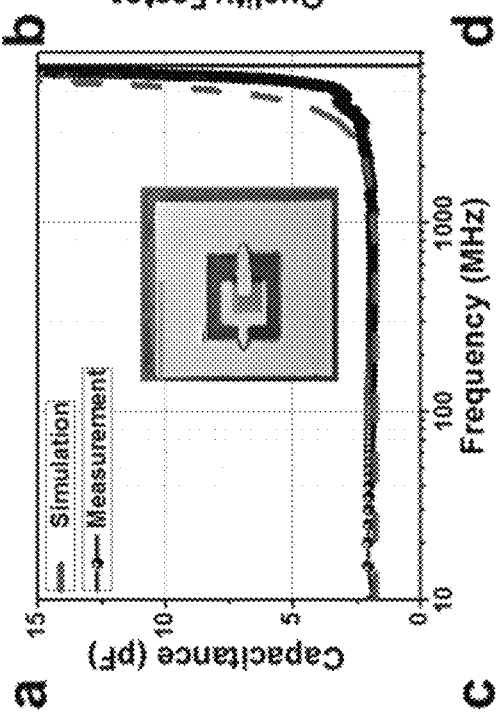
Figure 17D:
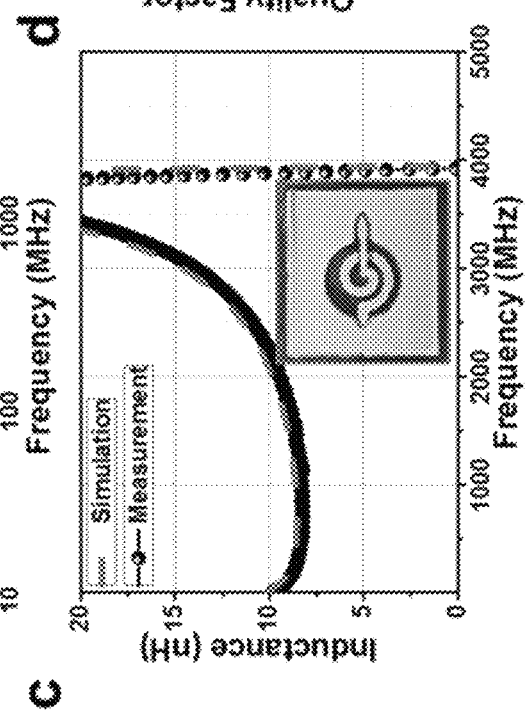

An inductor has also been tested, as shown in FIGS. 17C, 17D. This 1.5 turn inductor has an outer diameter of 4 mm with a 600-μm-thick spiral, has a self-resonance at 4 GHz and is approximately 8 nH at a frequency of 1 GHz. The quality factor in simulation (FIG. 17D) is slightly higher than the measured results (FIG. 17C). This is likely due to there being greater resistance from the printed silver ink than simulated; the inductors are extremely sensitive to the conductivity and thickness of the printed ink. These inductors have been printed with five layers of SOC ink and show a peak quality factor of ~8. The quality factors for both the inductors and capacitors are considered state-of-the-art among inkjet-printed passives, even with the low 80° C. processing temperature.[8,9]

The capacitor and inductor were implemented in a classic Butterworth low pass filter with a cutoff frequency of 2.0 GHz. 31 The Butterworth filter provides a maximally flat passband, and the low pass filter was designed in a full-wave EM simulation in Ansoft HFSS to finalize the layout. FIG. 18A shows a microscopy image of the fabricated filter. There is an inset depicting the corresponding placement of the capacitor and inductor for clarity. The capacitor area is further visualized by the cross-sectional SEM image in FIG. 18B. From the cut, the printed silver thickness at both layers and the 11-μm-thick dielectric spacing of the capacitor are clear. The measured frequency response of the filter in FIGS. 18C, 18D matches well with the HFSS simulation with a 3-dB cutoff at 2 GHz. There is signal rejection near 10 dB at 3 GHz and better than 20 dB at 4 GHz. The filter has no ripple in the passband, as expected, and an insertion loss of 0.8 dB at 1 GHz from the zoomed-in response of FIG. 18D. The low insertion loss is excellent for a first ever fully inkjet-printed lumped element filter, especially considering the temperature constraints of 80° C. The performance is state of the art, even compared to previous 2D distributed printed filters where nanoparticles are printed on a standard substrate, reporting insertion losses ranging from 3.6 to 10 dB.[11, 12, 13, 14, 15]

Discussion

Inkjet printing is transitioning from solely a graphic arts medium into a useful fabrication tool. The ability to deposit multiple materials and the scalability of inkjet systems with hundreds of nozzles make it possible to realize large and complex parts. A process is presented herein in which inkjet-printed UV-cured polymer and silver ink are integrated together. A major challenge is integrating a metal with the low-temperature UV-cured plastic material. The novel SOC ink presented herein has been deployed, developed in-house, and provides a conductivity of 1×107 S/m at 80° C. to combine the materials effectively. The combination of quick (5-minute) IR curing of the silver and rapid UV curing of the polymer in an ambient environment makes this an attractive method for fabrication. The capacitor and inductor exhibit state-of-the-art quality factors of ~20 and 8, respectively, in the radio frequency regime and compare well with electromagnetic simulation models. By implementing these components, a low pass filter has been fabricated with an insertion loss of 0.8 dB at 1 GHz.

REFERENCES

1. Snyder T, Andrews M, Weislogel M, Moeck P, Adams D. 3D Systems' Technology Overview and New Applications in Manufacturing. 3D Print Addit Manuf. 2014 September; 1(3):169-76.
2. Wu S-Y, Yang C, Hsu W, Lin L. 3D-printed microelectronics for integrated circuitry and passive wireless sensors. Microsyst Nanoeng. 2015 Jul. 20; 1: 15013.

3. Chieh J-C S, Dick B, Loui S, Rockway J D. Development of a Ku-Band Corrugated Conical Horn Using 3-D Print Technology. IEEE Antennas Wirel Propag Lett. 2014; 13: 201-4.
4. Nayeri P, Liang M, Sabory-Garcia R A, Tuo M, Yang F, Gehm M, et al. 3D Printed Dielectric Reflectarrays: Low-Cost High-Gain Antennas at Sub-Millimeter Waves. IEEE Trans Antennas Propag. 2014 April; 62(4):2000-8.
5. Tsang H H, Barton J H, Rumpf R C, Garcia C R. Effects of extreme surface roughness on 3D printed horn antenna. Electron Lett. 2013 Jun. 6; 49(12): 734-6.
6. Mckerricher G, Titterington D, Shamim A. A Fully Inkjet Printed 3D Honeycomb Inspired Patch Antenna. IEEE Antennas Wirel Propag Lett. 2015; 1-1.
7. Redinger D, Molesa S, Yin S, Farschi R, Subramanian V. An Ink-Jet-Deposited Passive Component Process for RFID. IEEE Trans Electron Devices. 2004 December; 51 (12): 1978-83.
8. McKerricher G, Perez J G, Shamim A. Fully Inkjet Printed R F Inductors and Capacitors Using Polymer Dielectric and Silver Conductive Ink With Through Vias. IEEE Trans Electron Devices. 2015 March; 62(3): 1002-9.
9. Cook B S, Mariotti C, Cooper J R, Revier D, Tehrani B K, Aluigi L, et al. Inkjet-printed, vertically-integrated, high-performance inductors and transformers on flexible LCP substrate. In IEEE; 2014 [cited 2015 Jul. 8]. p. 1-4. Available from: http://ieeexplore.ieee.org/lpdocs/epic03/wrapper.htm?arnumber=6848575
10. Menicanin A B, Zivanov L D, Damnjanovic M S, Maric A M. Low-Cost CPW Meander Inductors Utilizing Ink-Jet Printing on Flexible Substrate for High-Frequency Applications. IEEE Trans Electron Devices. 2013 February; 60(2): 827-32.
11. Sette D, Blayo A, Poulain C, Mercier D. Silver nanoparticle inkjet printed 17 GHz filter. In: Microwave Symposium Digest (IMS), 2013 IEEE MTT-S International. 2013. p. 1-4.
12. Sriprachuabwong C, Srichan C, Lomas T, Tuantranont A. Simple R C low pass filter circuit fabricated by unmodified desktop inkjet printer. In: 2010 International Conference on Electrical Engineering/Electronics Computer Telecommunications and Information Technology (ECTI-CON). 2010. p. 929-32.
13. Ahmad W, Budimir D, Maric A, Ivanisevic N. Inkjet printed bandpass filters and filtennas using silver nanoparticle ink on flexible substrate. In: 2015 IEEE International Symposium on Antennas and Propagation USNC/URSI National Radio Science Meeting. 2015. p. 145-6.
14. Arabi E, McKerricher G, Shamim A. Comparison of filters: Inkjet printed on PEN substrate versus a laser-etched on LCP substrate. In Rome Italy: IEEE; 2014 [cited 2015 Oct. 5]. p. 1226-9. Available from: http://ieeexplore.ieee.org/lpdocs/epic03/wrapper.htm?arnumber=6986663
15. Kao H L, Cho C L, Chang L C. Inkjet-Printed Interdigital Coupled Line Filter on Liquid Crystal Polymer Substrate. IEEE Electron Device Lett. 2013 December; 34(12): 1584-6.
16. Sridhar A, Reiding J, Adelaar H, Achterhoek F, van Dijk D J, Akkerman R. Inkjet-printing- and electroless-plating-based fabrication of R F circuit structures on high-frequency substrates. J Micromechanics Microengineering. 2009 Aug. 1; 19(8): 85020.
17. Magdassi S, editor. The chemistry of inkjet inks. Singapore; Hackensack, N J: World Scientific; 2010.345 p.
18. Stratasys. Material Saftey Data Sheet—Objet Vero White Plus [Internet]. Stratasys; 2014 July [cited 2015 Nov. 9]. Report No.: RGD835. Available from: www-.Stratasys.com
19. Stratasys. Polyjet material specifications—Vero white plus [Internet]. Stratasys; 2014 July [cited 2015 Nov. 9]. Available from: www.stratasysdirect.com
20. Djordjevic A R, Likar-Smiljanic V D, Sarkar T K. Wideband frequency-domain characterization of FR-4 and time-domain causality. IEEE Trans Electromagn Compat. 2001 November; 43(4): 662-7.
21. Walker S B, Lewis J A. Reactive Silver Inks for Patterning High-Conductivity Features at Mild Temperatures. J Am Chem Soc. 2012 Jan. 25; 134(3): 1419-21.
22. Dong Y, Li X, Liu S, Zhu Q, Li J-G, Sun X. Facile synthesis of high silver content MOD ink by using silver oxalate precursor for inkjet printing applications. Thin Solid Films. 2015 Aug. 31; 589: 381-7.
23. Hong C M, Wagner S. Inkjet printed copper source/drain metallization for amorphous silicon thin-film transistors. IEEE Electron Device Lett. 2000 August; 21 (8): 384-6.
24. Steven Brett Walker, Bok Yeop Ahn, Jennifer A. Lewis. Reactive Silver Inks for High-Performance Printed Electronics. Sigma Aldrich; 2015. (Sigma Aldrich Technical Documents).
25. Vaseem M, McKerricher G, Shamim A. Robust Design of a Particle-Free Silver-Organo-Complex Ink with High Conductivity and Inkjet Stability for Flexible Electronics. ACS Appl Mater Interfaces. 2016 Jan. 13; 8(1): 177-86.
26. Derby B. Inkjet Printing of Functional and Structural Materials: Fluid Property Requirements, Feature Stability, and Resolution. Annu Rev Mater Res. 2010 June; 40 (1):395-414.
27. Tseng H-Y. Scaling of Inkjet-Printed Transistors using Novel Printing Techniques [Internet]. [EECS Department, University of California, Berkeley]; 2011. Available from: http://www.eecs.berkeley.edu/Pubs/TechRpts/2011/EECS-2011-146.html
28. Wubbenhorst M, Murray C A, Forrest J A, Dutcher J R. Dielectric relaxations in ultra-thin films of PMMA: assessing the length scale of cooperativity in the dynamic glass transition. In: 11th International Symposium on Electrets, 2002 ISE 11 Proceedings. 2002. p. 401-6.
29. Frickey D A. Conversions between S, Z, Y, H, ABCD, and T parameters which are valid for complex source and load impedances. IEEE Trans Microw Theory Tech. 1994 February; 42(2): 205-11.
30. Okada K, Masu K. Modeling of Spiral Inductors. In: Zhurbenko V, editor. Advanced Microwave Circuits and Systems [Internet]. InTech; 2010 [cited 2014 Dec. 24]. Available from: http://www.intechopen.com/books/advanced-microwave-circuits-and-systems/modeling-of-spiral-inductors
31. Butterworth S. On the Theory of Filter Amplifiers. Exp Wirel Wirel Eng. 1930; 7: 536-41.

Ratios, concentrations, amounts, and other numerical data may be expressed in a range format. It is to be understood that such a range format is used for convenience and brevity, and should be interpreted in a flexible manner to include not only the numerical values explicitly recited as the limits of the range, but also to include all the individual numerical values or sub-ranges encompassed within that range as if each numerical value and sub-range is explicitly recited. To illustrate, a concentration range of "about 0.1% to about 5%" should be interpreted to include not only the explicitly recited concentration of about 0.1% to about 5%, but also include individual concentrations (e.g., 1%, 2%, 3%, and 4%) and the sub-ranges (e.g., 0.5%, 1.1%, 2.2%, 3.3%, and 4.4%) within the indicated range. In an embodiment, the term "about" can include traditional rounding according to significant figure of the numerical value. In addition, the phrase "about 'x' to 'y'" includes "about 'x' to about 'y'".

It should be emphasized that the above-described embodiments are merely examples of possible implementations. Many variations and modifications may be made to the above-described embodiments without departing from the principles of the present disclosure. All such modifications and variations are intended to be included herein within the scope of this disclosure and protected by the following claims.

Therefore, the following is claimed:

1. A method of preparing a metal integrated 3D object comprising depositing a first layer of UV dielectric ink using a 3D inkjet printer and curing the first layer to form a 3D object;
depositing a second layer of UV dielectric ink over the first layer using an inkjet printer and curing the second layer to provide a smoothed surface to the 3D object;
depositing a first layer of silver-organo-complex (SOC) ink on at least a portion of the smoothed surface using an inkjet printer and curing the SOC ink layer, wherein the SOC ink comprises a silver cation complexed with a first complexing agent and a second complexing agent and a carboxylic acid or a salt of a carboxylic acid; and
depositing a third layer of UV dielectric ink over at least a portion of the first SOC ink layer using an inkjet printer and curing the third layer.

2. The method of claim 1, wherein the first SOC ink layer is cured by IR heating.

3. The method of claim 2, wherein IR heating is performed at a temperature of less than 80° C.

4. The method of claim 1, wherein the second layer of UV dielectric ink is allowed to spread over the first layer of UV dielectric ink before curing.

5. The method of claim 1, further comprising depositing an additional layer of SOC ink onto the third layer of UV dielectric ink and curing the additional SOC ink layer.

6. The method of claim 5, wherein the additional layer of SOC ink contacts the first SOC ink layer.

7. The method of claim 1, wherein the first complexing agent is an alkyl amine selected from the group consisting of methylamine, ethylamine, propylamine, butylamine, and amylamine.

8. The method of claim 1, wherein said second complexing agent is an aminoalcohol selected from the group consisting of methanolamine, ethanolamine, propanolamine, and butanolamine.

9. The method of claim 1, wherein the carboxylic acid is a short chain carboxylic acid having 1-3 carbon atoms.

10. The method of claim 1, wherein the SOC ink further comprises 2-hydroxyethylcellulose.

11. The method of claim 1, wherein the SOC ink has a pH of about 10.5.

12. The method of claim 1, further comprising, before depositing the third UV dielectric ink layer, dipping the 3D object in perfluorodecanethiol.

13. The method of claim 1, wherein the smoothed surface has a roughness value RMS of less than 500 nm.

14. A Radio Frequency (RF) Passive component made by the method of claim 1.

15. The RF Passive component of claim 14, selected from the group consisting of capacitors, filters, and inductors.

* * * * *